US012772902B2

(12) United States Patent
Shen et al.

(10) Patent No.: US 12,772,902 B2
(45) Date of Patent: Oct. 20, 2026

(54) SEMICONDUCTOR PACKAGE HAVING DUMMY METAL PATTERNS

(71) Applicant: Taiwan Semiconductor Manufacturing Co., Ltd., Hsinchu (TW)

(72) Inventors: Wen-Wei Shen, Hsinchu (TW); Sung-Hui Huang, Dongshan Township (TW); Shang-Yun Hou, Jubei City (TW); Sen-Bor Jan, Tainan City (TW); Szu-Po Huang, Taichung City (TW); Kuan-Yu Huang, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 654 days.

(21) Appl. No.: 18/150,525

(22) Filed: Jan. 5, 2023

(65) Prior Publication Data

US 2023/0378132 A1 Nov. 23, 2023

Related U.S. Application Data

(60) Provisional application No. 63/406,529, filed on Sep. 14, 2022, provisional application No. 63/342,823, filed on May 17, 2022.

(51) Int. Cl.

*H10W 90/00* (2026.01)
*H10W 20/00* (2026.01)
(Continued)

(52) U.S. Cl.

CPC ....... *H10W 90/00* (2026.01); *H10W 20/0698* (2026.01); *H10W 70/614* (2026.01);
(Continued)

(58) Field of Classification Search

CPC ................ H01L 21/563; H01L 21/565; H01L 21/76895; H01L 21/6835; H01L 25/0655;
(Continued)

(56) References Cited

U.S. PATENT DOCUMENTS 8,993,380 B2 3/2015 Hou et al.
9,281,254 B2 3/2016 Yu et al.
(Continued)

FOREIGN PATENT DOCUMENTS

CN 104576517 A 4/2015
CN 110838478 A 2/2020
(Continued)

*Primary Examiner* — Wael M Fahmy
*Assistant Examiner* — Tiberiu Dan Onuta
(74) *Attorney, Agent, or Firm* — Slater Matsil, LLP

(57) ABSTRACT

A semiconductor device includes: a substrate; a plurality of dies attached to a first side of the substrate; a molding material on the first side of the substrate around the plurality of dies; a first redistribution structure on a second side of the substrate opposing the first side, where the first redistribution structure includes dielectric layers and conductive features in the dielectric layers, where the conductive features include conductive lines, vias, and dummy metal patterns isolated from the conductive lines and the vias; and conductive connectors attached to a first surface of the first redistribution structure facing away from the substrate.

20 Claims, 20 Drawing Sheets

(51) Int. Cl.

| | |
|---|---|
| ***H10W 70/60*** | (2026.01) |
| ***H10W 70/63*** | (2026.01) |
| ***H10W 70/65*** | (2026.01) |
| ***H10W 72/90*** | (2026.01) |
| ***H10W 74/01*** | (2026.01) |
| ***H10W 74/15*** | (2026.01) |

(52) U.S. Cl.

CPC ......... *H10W 70/635* (2026.01); *H10W 70/65* (2026.01); *H10W 74/012* (2026.01); *H10W 74/016* (2026.01); *H10W 74/15* (2026.01); *H10W 72/942* (2026.01); *H10W 90/722* (2026.01)

(58) Field of Classification Search

CPC ... H01L 25/18; H01L 25/50; H01L 23/49827; H01L 23/49838; H01L 23/5389; H01L 23/5385; H01L 23/552; H01L 23/49816; H01L 24/05; H01L 24/16; H01L 2224/05569; H01L 2224/16146; H01L 2224/73204; H01L 2224/81; H01L 2221/68331; H01L 2221/68345; H01L 2924/3511

See application file for complete search history.

(56) References Cited

U.S. PATENT DOCUMENTS

| | | | | |
|---|---|---|---|---|
| 9,299,649 | B2 | 3/2016 | Chiu et al. | |
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,461,018 | B1 | 10/2016 | Tsai et al. | |
| 9,496,189 | B2 | 11/2016 | Yu et al. | |
| 9,666,502 | B2 | 5/2017 | Chen et al. | |
| 9,735,131 | B2 | 8/2017 | Su et al. | |
| 10,790,158 | B2 | 9/2020 | Lin et al. | |
| 11,984,349 | B2 | 5/2024 | Han et al. | |
| 2016/0358818 | A1* | 12/2016 | Kuo | H10W 20/023 |
| 2017/0317029 | A1* | 11/2017 | Hsieh | H10W 70/095 |
| 2021/0090985 | A1* | 3/2021 | Shih | H10P 72/74 |
| 2021/0091022 | A1 | 3/2021 | Chen et al. | |
| 2021/0098409 | A1* | 4/2021 | Chen | H10P 54/00 |
| 2021/0125907 | A1* | 4/2021 | Huang | H10W 42/121 |
| 2021/0407962 | A1* | 12/2021 | Kim | H10W 90/00 |
| 2022/0052009 | A1 | 2/2022 | Huang et al. | |
| 2022/0077007 | A1* | 3/2022 | Kim | H01L 22/34 |

FOREIGN PATENT DOCUMENTS

| | | | |
|---|---|---|---|
| CN | 112563218 | A | 3/2021 |
| TW | I763601 | B | 5/2022 |

* cited by examiner

SEMICONDUCTOR PACKAGE HAVING DUMMY METAL PATTERNS

PRIORITY CLAIM AND CROSS-REFERENCE

This application claims priority to U.S. Provisional Patent Application No. 63/342,823, filed May 17, 2022 and U.S. Provisional Patent Application No. 63/406,529, filed Sep. 14, 2022, which applications are hereby incorporated by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. As another example, a chip is bonded to an interposer, then the interposer is bonded to a substrate to form a stacked semiconductor structure. In some embodiments, to form the stacked semiconductor structure, a plurality of semiconductor chips are attached to a wafer, and a dicing process is performed next to separate the wafer into a plurality of interposers, where each of the interposers has one or more semiconductor chips attached thereto. The interposer with semiconductor chips(s) attached is then attached to a substrate (e.g., a printed circuit board) to form the stacked semiconductor structure. These and other advanced packaging technologies enable production of semiconductor devices with enhanced functionalities and small footprints.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
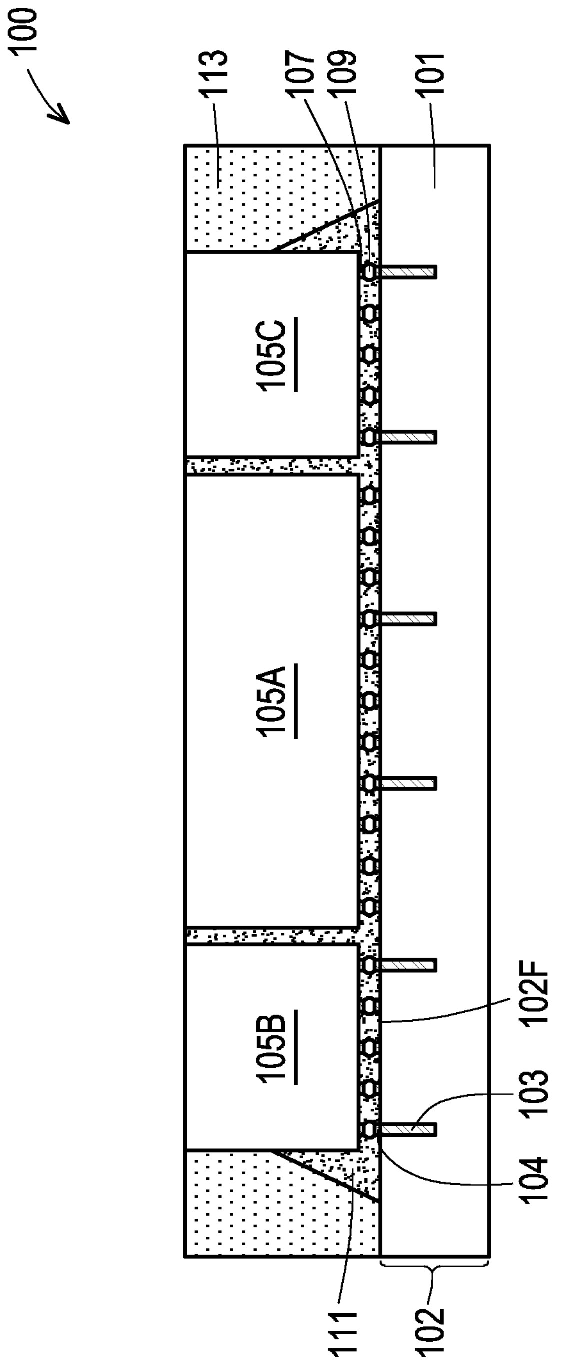
FIGS. 1-3 illustrate cross-sectional views of a semiconductor device at various stages of manufacturing, in accordance with an embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. Throughout the description, unless otherwise specified, like reference numerals in different figures refer to the same or similar component formed by a same or similar method using a same or similar material(s).

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a semiconductor structure includes an interposer, a plurality of dies attached to a first side of the interposer, and a redistribution structure on a second opposing side of the interposer. Conductive features of the redistribution structure include conductive lines, vias, and dummy metal patterns. The dummy metal patterns may be island-shaped, strip-shaped, or mesh-shaped, and each metal layer of the conductive features may have different combinations of the different shapes of the dummy metal patterns. In a plan view, the dummy metal patterns may be formed along interface regions between the plurality of dies, or along the perimeter of the semiconductor structure. The dummy metal patterns help to reduce warpage of the semiconductor structure, thereby reducing issues such as cold joints and improving bonding yield.

Figure 2:
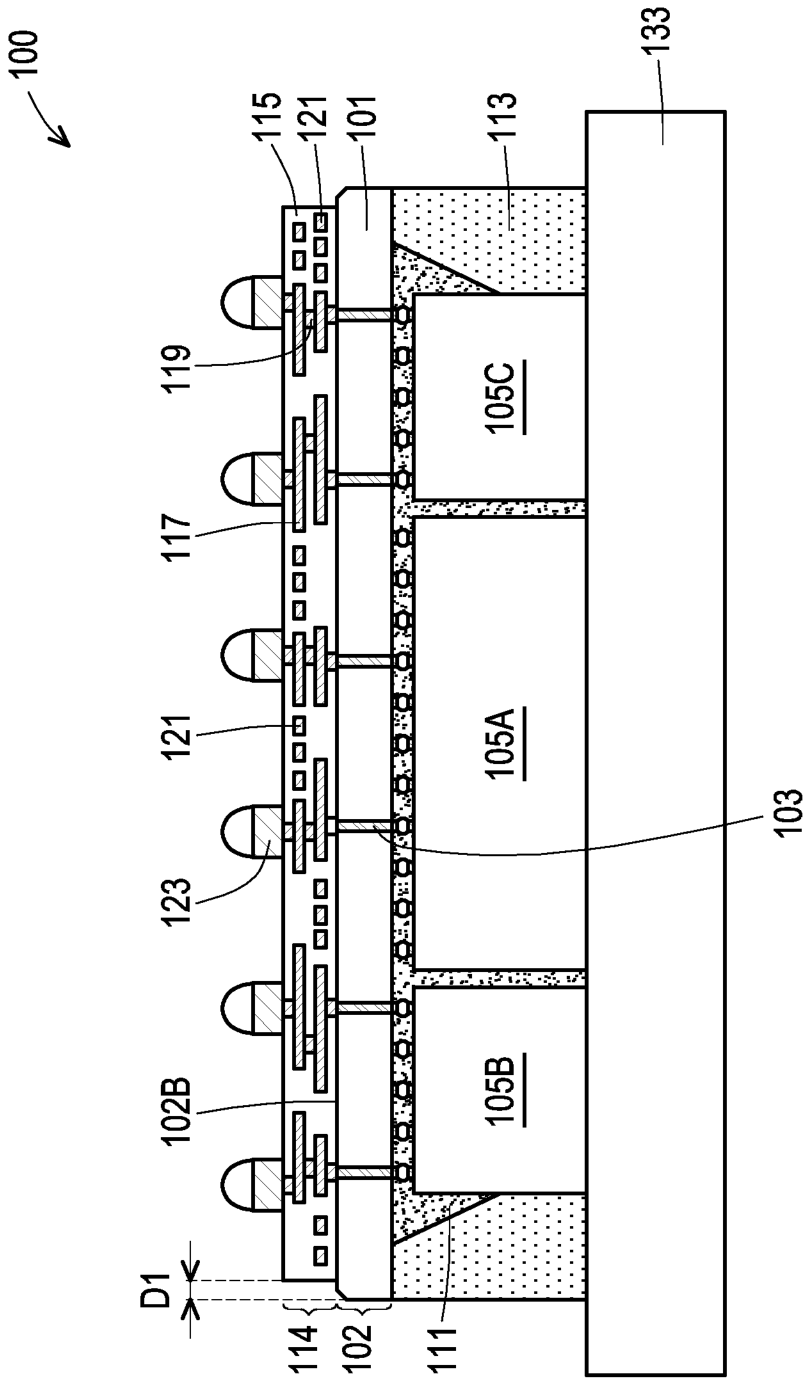
Figure 3:
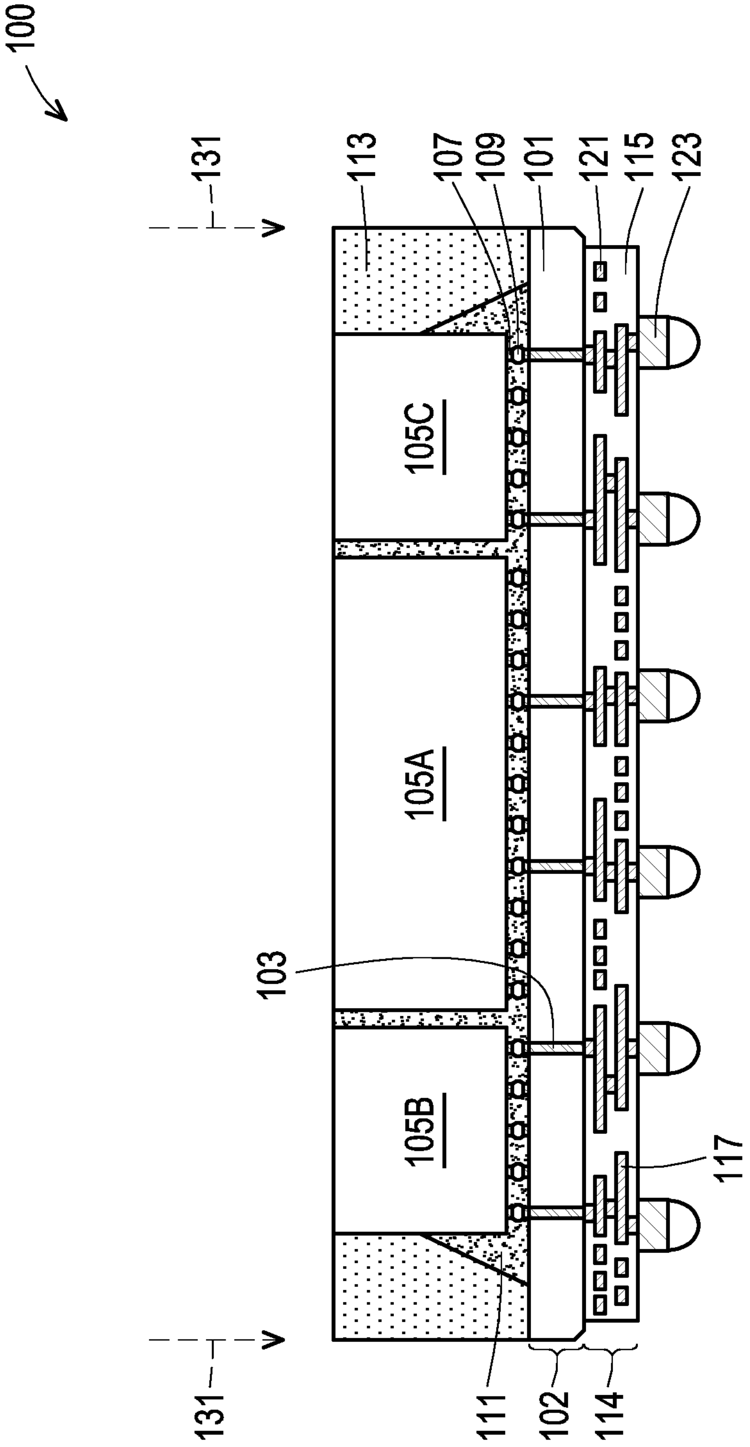

FIGS. 1-3 illustrate cross-sectional views of a semiconductor device 100 at various stages of manufacturing, in accordance with an embodiment.

Referring now to FIG. 1, a plurality of dies, such as dies 105A, 105B, and 105C, are attached to a front side 102F of an interposer 102. The dies 105A, 105B, and 105C are collectively referred to as dies 105 in the discussion herein. The dies 105 may also be referred to as semiconductor dies, chips, or integrated circuit (IC) dies. The dies 105 are a same type of dies (e.g., memory dies, or logic dies), in some embodiments. In other embodiments, the dies 105 are of different types. For example, the die 105A may be a System-On-a-Chip (SOC) die that includes, e.g., a central processing unit (CPU), memory interfaces, Input/Output (I/O) devices, and I/O interfaces. The die 105B may be, e.g., a memory die, such as a High-Bandwidth Memory (HBM) die, and the die 105C may be, e.g., a chiplet that contains a well-defined subset of functionalities for integration with the die 105A. The number of dies 105, and the type of dies 105 illustrated in FIG. 1 is simply a non-limiting example. Other numbers of dies, other types of dies, or other arrangement (e.g., placement) of the dies are also possible, and are fully intended to be included within the scope of the present disclosure. For example, FIGS. 6-11 illustrate various example plan views of dies 105 integrated in the semiconductor device 100.

In some embodiments, each of the dies 105 includes a substrate, electrical components (e.g., transistors, resistors, capacitors, diodes, or the like) formed in/on the substrate, and an interconnect structure over the substrate connecting the electrical components to form functional circuits of the die 105. The die 105 also includes conductive pillars 107 (also referred to as die connectors) that provide electrical connection to the circuits of the die 105.

The substrate of the die 105 may be a semiconductor substrate, doped or undoped, or an active layer of a silicon-on-insulator (SOI) substrate. Generally, an SOI substrate comprises a layer of a semiconductor material such as silicon, germanium, silicon germanium, silicon germanium on insulator (SGOI), or combinations thereof. Other substrates that may be used include multi-layered substrates, gradient substrates, or hybrid orientation substrates.

The electrical components of the die 105 comprise a wide variety of active devices (e.g., transistors) and passive devices (e.g., capacitors, resistors, inductors), and the like. The electrical components of the die 105 may be formed using any suitable methods either within or on the substrate of the die 105. The interconnect structure of the die 105 comprises one or more metallization layers (e.g., copper layers) formed in one or more dielectric layers, and is used to connect the various electrical components to form functional circuitry. In an embodiment, the interconnect structure is formed of alternating layers of dielectric and conductive material (e.g., copper) and may be formed through any suitable process (such as deposition, damascene, dual damascene, etc.).

One or more passivation layers (not shown) may be formed over the interconnect structure of the die 105 in order to provide a degree of protection for the underlying structures of the die 105. The passivation layer may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The passivation layer may be formed through a process such as chemical vapor deposition (CVD), although any suitable process may be utilized.

Conductive pads (not shown) may be formed over the passivation layer and may extend through the passivation layer to be in electrical contact with the interconnect structure of the die 105. The conductive pads may comprise aluminum, but other materials, such as copper, may also be used.

Conductive pillars 107 of the die 105 are formed on the conductive pads to provide conductive regions for electrical connection to the circuits of the die 105. The conductive pillars 107 may be copper pillars, contact bumps such as microbumps, or the like, and may comprise a material such as copper, tin, silver, or other suitable material.

Looking at the interposer 102, which includes a substrate 101, through vias 103 (also referred to as through-substrate vias (TSVs)), and conductive bumps 104 on the front side 102F of the interposer 102. The front side 102F is also the upper surface of the substrate 101 in the example of FIG. 1.

The substrate 101 may be, e.g., a silicon substrate, doped or undoped, or an active layer of a silicon-on-insulator (SOI) substrate. However, the substrate 101 may alternatively be a glass substrate, a ceramic substrate, a polymer substrate, or any other substrate that may provide a suitable protection and/or interconnection functionality.

In some embodiments, the substrate 101 includes electrical components, such as resistors, capacitors, signal distribution circuitry, combinations of these, or the like. These electrical components may be active, passive, or a combination thereof. In other embodiments, the substrate 101 is free from both active and passive electrical components therein, and may only be used to provide connection/rerouting of electrical signals. All such combinations are fully intended to be included within the scope of this disclosure.

In the example of FIG. 1, through vias 103 extend from the upper surface (e.g., 102F) of the substrate 101 toward the lower surface of the substrate 101. Note that the through vias 103 do not extend through the substrate 101. In a subsequent thinning process, the substrate 101 will be thinned to expose the through vias 103 at the lower surface. The through vias 103 may be formed of a suitable conductive material such as copper, tungsten, aluminum, alloys, doped polysilicon, combinations thereof, and the like. A barrier layer may be formed between the through vias 103 and the substrate 101. The barrier layer may comprise a suitable material such as titanium nitride, although other materials, such as tantalum nitride, titanium, or the like, may alternatively be utilized.

The conductive bumps 104 are formed on the front side 102F of the interposer 102, and may be any suitable type of external contacts, such as microbumps, copper pillars, a copper layer, a nickel layer, a lead free (LF) layer, an electroless nickel electroless palladium immersion gold (ENEPIG) layer, a Cu/LF layer, a Sn/Ag layer, a Sn/Pb, combinations of these, or the like. The conductive bumps 104 may formed to electrically couple to, e.g., the through vias 103, or routing lines (if formed) on the front side 102F of the interposer 102.

As illustrated in FIG. 1, the conductive pillar 107 of the dies 105 are bonded to the conductive bumps 104 of the interposer 102 by, e.g., solder regions 109. A reflow process may be performed to bond the dies 105 to the interposer 102.

After the dies 105 are bonded to the interposer 102, an underfill material 111 is formed between the dies 105 and the interposer 102. The underfill material 111 may, for example, comprise a liquid epoxy that is dispensed in a gap between the dies 105 and the interposer 102, e.g., using a dispensing needle or other suitable dispensing tool, and then cured to harden. As illustrated in FIG. 1, the underfill material 111 fills the gap between the dies 105 and the interposer 102, and may also fill gaps between adjacent dies 105. In addition, the underfill material 111 may extend along sidewalls of, e.g., dies 105B and 105C. In other embodiments, the underfill material 111 is omitted.

Next, a molding material 113 is formed over the interposer 102 and around the dies 105. The molding material 113 also surrounds the underfill material 111 in embodiments where the underfill material 111 is formed. The molding material 113 may comprise an epoxy, an organic polymer, a polymer with or without a silica-based filler or glass filler added, or other materials, as examples. In some embodiments, the molding material 113 comprises a liquid molding compound (LMC) that is a gel type liquid when applied. The molding material 113 may also comprise a liquid or solid when applied. Alternatively, the molding material 113 may comprise other insulating and/or encapsulating materials. The molding material 113 is applied using a wafer level molding process in some embodiments. The molding material 113 may be molded using, for example, compressive molding, transfer molding, molded underfill (MUF), or other methods.

Next, the molding material 113 is cured using a curing process, in some embodiments. The curing process may comprise heating the molding material 113 to a predetermined temperature for a predetermined period of time, using an anneal process or other heating process. The curing process may also comprise an ultra-violet (UV) light exposure process, an infrared (IR) energy exposure process, combinations thereof, or a combination thereof with a heating process. Alternatively, the molding material 113 may be cured using other methods. In some embodiments, a curing process is not included.

After the molding material 113 is formed, a planarization process, such as chemical and mechanical planarization (CMP), may be performed to remove excess portions of the molding material 113 from over the dies 105, such that the molding material 113 and the dies 105 have a coplanar upper surface.

Next, in FIG. 2, the structure formed in FIG. 1 is flipped over and is attached to a carrier 133, e.g., by an adhesive layer. The carrier 133 may be made of a material such as silicon, polymer, polymer composite, metal foil, ceramic, glass, glass epoxy, beryllium oxide, tape, or other suitable material for structural support. The adhesive layer (not shown in FIG. 2) is deposited or laminated over the carrier 133, in some embodiments. The adhesive layer may be photosensitive and may be easily detached from the carrier 133 by shining, e.g., an ultra-violet (UV) light on the carrier 133 in a subsequent carrier de-bonding process. For example, the adhesive layer may be a light-to-heat-conversion (LTHC) coating.

Next, the interposer 102 is thinned from a backside 102B of the interposer 102. A thinning process, such as an etching process, a grinding process, combinations of, or the like, may be performed to reduce the thickness of the substrate 101, such that the through vias 103 are exposed at the backside 102B.

Next, a redistribution structure 114 is formed over the interposer 102. The redistribution structure 114 comprises conductive features such as one or more layers of conductive lines 117 and vias 119 formed in a plurality of dielectric layers 115. In some embodiments, the dielectric layers 115 are formed of a polymer, such as polybenzoxazole (PBO), polyimide, benzocyclobutene (BCB), or the like. In other embodiments, the dielectrics layer 115 are formed of a nitride such as silicon nitride; an oxide such as silicon oxide, phosphosilicate glass (PSG), borosilicate glass (BSG), boron-doped phosphosilicate glass (BPSG), or the like; or the like. The dielectric layers 115 may be formed by any acceptable deposition process, such as spin coating, chemical vapor deposition (CVD), laminating, the like, or a combination thereof.

In some embodiments, the conductive features of the redistribution structure 114 comprise conductive lines 117 and vias 119 formed of a suitable conductive material such as copper, titanium, tungsten, aluminum, or the like. Each layer of the conductive lines 117 (and its corresponding underlying vias 119) may be formed by, e.g., forming openings in the dielectric layer 115 to expose underlying conductive features, forming a seed layer over the dielectric layer 115 and in the openings, forming a patterned photoresist with a designed pattern (e.g., openings) over the seed layer, plating (e.g., electroplating or electroless plating) the conductive material in the designed pattern and over the seed layer, and removing the photoresist and portions of seed layer on which the conductive material is not formed. The number of layers of conductive lines 117 and vias 119 in the redistribution structure 114 illustrated in FIG. 2 is a non-limiting example, other numbers are also possible and are fully intended to be included within the scope of this disclosure.

Notably, in the illustrated embodiments, dummy metal patterns 121 are formed as part of the conductive features of the redistribution structure 114. The dummy metal patterns 121 are metal patterns that are electrically isolated. In other words, the dummy metal patterns 121 are not configured to be electrically coupled to electrical signals (e.g., power supply signals, or data/controls signals) of the semiconductor device 100.

In some embodiments, the dummy metal patterns 121 are formed in the same processing steps to form the other conductive features of the redistribution structure 114. In the example of FIG. 2, the dummy metal patterns 121 are formed in the same metal layers as the conductive lines 117 using the same conductive material (e.g., copper), and no dummy metal patterns 121 is formed in the metal layers of the vias 119. In some embodiments, the dummy metal patterns 121 are also formed in the same metal layer as the vias 119. These and other variation are fully intended to be included within the scope of the present disclosure.

In the example of FIG. 2, metal layers of the redistribution structure 114 that have the conductive lines 117 are interleaved (e.g., alternate) with metal layers of the redistribution structure 114 that have the vias 119. To facilitate discussion herein, the metal layers having the conductive lines 117 are sequentially numbered as metal layers L1, L2, and so on, with the metal layer L1 being the metal layer having the conductive lines 117 and closest to the interposer 102. The metal layers having the vias 119 are sequentially numbered as metal layers V1, V2, and so on, with the metal layer V1 being the metal layer having the vias 119 and closest to the interposer 102. Therefore, in the example of FIG. 2, the dummy metal patterns 121 are formed in the metal layers L1, L2, and so on, and no dummy metal pattern 121 is formed in the metal layers V1, V2, and so on. Details of the dummy metal patterns 121 are discussed hereinafter with reference to FIGS. 4A-4C and 5-11.

Still referring to FIG. 2, after the redistribution structure 114 is formed, external connectors 123 (also referred to conductive connectors) are formed over and electrically coupled to the redistribution structure 114. In an embodiment, the external connectors 123 are conductive bumps such as microbumps and may comprise a material such as tin, or other suitable materials, such as silver or copper. In an embodiment in which the external connectors 123 are tin solder bumps, the external connectors 123 may be formed by initially forming a layer of tin through any suitable method such as evaporation, electroplating, printing, solder transfer, ball placement. Once a layer of tin has been formed on the structure, a reflow is performed in order to shape the material into the desired bump shape with a diameter of about, e.g., 20 μm, although any suitable size may alternatively be utilized.

However, as one of ordinary skill in the art will recognize, while external connectors 123 have been described above as microbumps, these are merely intended to be illustrative and are not intended to limit the embodiments. Rather, any suitable type of external connectors, such as controlled collapse chip connection (C4) bumps, copper pillars, a copper layer, a nickel layer, a lead free (LF) layer, an electroless nickel electroless palladium immersion gold (ENEPIG) layer, a Cu/LF layer, a Sn/Ag layer, a Sn/Pb, combinations of these, or the like, may alternatively be utilized. Any suitable external connector, and any suitable process for forming the external connectors, may be utilized for the external connectors 123, and all such external connectors are fully intended to be included within the scope of the embodiments.

In some embodiments, a width of the redistribution structure 114 is formed to be smaller than a width of the interposer 102, such that sidewalls of the redistribution structure 114 are recessed from respective sidewalls of the interposer 102. An offset D1 (e.g., a lateral distance) between a sidewall of the redistribution structure 114 and a respective sidewall of the interposer 102 may be between about 20 μm and about 200 μm, as an example. The offset D1 advantageously reduces or prevents delamination of the redistribution structure 114 in a subsequent dicing process.

In some embodiments, the redistribution structure 114 is formed over a wafer that comprises multiple interposer 102, such that multiple semiconductor devices 100 are formed simultaneously on the wafer. Then, an etching process is performed to remove portions of the redistribution structure 114 disposed along/near the dicing regions of the wafer, thereby forming the offset D1. In a subsequent dicing process, the offset D1 allows the dicing to be performed without the blade used in the dicing process contacting the redistribution structure 114, thereby avoiding or reducing delamination of the redistribution structure 114 during the dicing process.

Next, in FIG. 3, the semiconductor device 100 in FIG. 2 is flipped over, and the external connectors 123 are attached to a dicing tape (not shown). Next, the carrier 133 is detached (de-bonded) from the semiconductor device 100 through a de-bonding process. The de-bonding process may remove the carrier 133 using any suitable process, such as etching, grinding, and mechanical peel off. In some embodiments, the carrier 133 is de-bonded by shining a laser or UV light over the surface of the carrier 133. The laser or UV light breaks the chemical bonds of the adhesive layer (e.g., LTHC) that binds to the carrier 133, and the carrier 133 can then be easily detached. Next, a dicing process is performed to cut along positions indicated by lines 131 in FIG. 3, which lines 131 are aligned with the dicing regions of the wafer. After the dicing process, a plurality of individual semiconductor devices 100 are formed, where each of the semiconductor devices 100 has the structure illustrated in FIG. 3.

As more and more dies with different functionalities are attached to the interposer 102 to achieve high level of integration in the semiconductor package (e.g., the semiconductor device 100), the size (e.g., surface area) of the interposer 102 increases. For interposer 102 having a large size, it is increasing difficult to keep the interposer flat (e.g., having a planar surface), and warpage control for the semiconductor device 100 becomes an increasingly important issue. Warpage in semiconductor devices is generally caused by the differences in the Coefficients of Thermal Expansion (CTEs) of the different materials used in the semiconductor device. As the different materials expand or contract at different levels with temperature changes, stress is produced in various region of the semiconductor device, and the stress may result in warpage of the semiconductor device.

Tests and analysis show that stress in a semiconductor package (e.g., the semiconductor device 100) may be especially high in certain areas, such as areas along/near the interface regions between the dies 105, which may due to the high temperature in the interface regions caused by the heavy data traffic (e.g., read and write operations) between the die 105A (e.g., the SOC die) and the dies 105B (e.g., HBM dies)/105C (e.g., chiplets). In addition, regions along the perimeters (e.g., sidewalls) of the semiconductor device may also experience high stress or higher warpage. The present disclosure uses dummy metal patterns 121 in the redistribution structure 114 to reduces the warpage. The dummy metal patterns 121 may be formed in the regions (e.g., interface regions, perimeter regions) having high temperature or high levels of stress to reduce warpage. The dummy metal patterns 121 may have different shapes to achieve different advantages (e.g., low induced stress, electromagnetic interference shielding). The dummy metal patterns 121 may help to dissipate heat in the high temperature regions. In addition, the dummy metal patterns 121 may help to achieve a more uniform metal density (therefore a more uniform CTE) in the redistribution structure 114 to reduce warpage. Furthermore, the dummy metal patterns 121 may increase the structural integrity (e.g., higher rigidity) of the redistribution structure 114 to reduce warpage. Various shapes, structures, and locations of the dummy metal patterns 121 are discussed below.

Figure 4A:
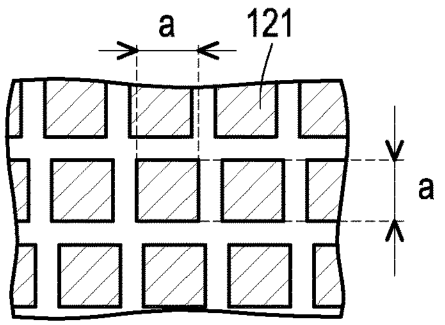
FIGS. 4A-4C illustrate various top views of dummy metal patterns, in accordance with some embodiments.
Figure 4B:
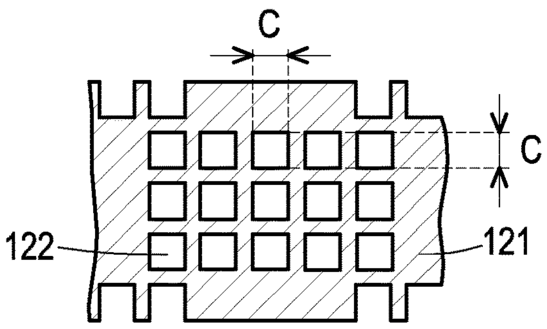
Figure 4C:
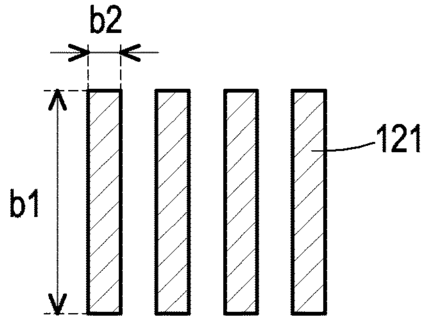

FIGS. 4A-4C illustrate various top views of dummy metal patterns 121, in accordance with some embodiments. In FIG. 4A, the dummy metal patterns 121 have an island shape, e.g., are formed in discrete (e.g., separate) rectangular or square shaped metal patterns. The island-shaped dummy metal patterns 121 may be formed in rows and columns. A dimension a (e.g., a width, or a length) of the rectangular or square shaped metal pattern is between about 5 μm and about 100 μm, as an example. An advantage of the island-shaped dummy metal patterns 121 is that the island-shaped dummy metal patterns 121 induce little, if any, stress in the redistribution structure 114.

In FIG. 4B, the dummy metal patterns 121 have a mesh shape, e.g., are formed as a metal mesh. For example, the dummy metal patterns 121 in FIG. 4B form a continuous (e.g., connected) metal region with holes 122. A dimension c (e.g., a width, or a length) of the hole 122 is between about 3 μm and about 50 μm, as an example. An advantage of the mesh-shaped dummy metal patterns 121 is that the mesh-shaped dummy metal patterns 121 provide excellent electromagnetic (EM) interference shielding for the semiconductor device 100.

In FIG. 4C, the dummy metal patterns 121 have a strip shape, e.g., are formed in discrete (e.g., separate) strip-shaped metal patterns. The strip-shaped dummy metal patterns 121 may be formed to extend in parallel to each other. A length $b_1$ of the strip-shaped dummy metal pattern may be between about 5 μm and about 100 μm, and a width $b_2$ of the strip-shaped dummy metal pattern may be between about 5 μm and about 100 μm, as an example. The length $b_1$ and the width $b_2$ are chosen to achieve a large aspect ratio, e.g. of $b_1/b_2 \geq 5$ or $b_1/b_2 \geq 10$. The strip-shaped dummy metal patterns 121 achieve a performance balance between the island-shaped dummy metal patterns 121 and the mesh-shaped dummy metal patterns 121, and therefore, induces low stress in the redistribution structure 114 and achieves certain level of EM interference shielding. In some embodiments, the stress induced by the strip-shaped dummy metal patterns 121 is along the longitudinal directions of the metal strips. Besides the shapes illustrated in FIGS. 4A-4C, other shapes are also possible, and are fully intended to be included within the scope of the present disclosure.

The various dummy metal patterns 121 may be formed in any of the metal layers (e.g., L1, L2, and so on) of the redistribution structure 114 in different combinations. For ease of discussion, the metal layers L1, L2, and so on, are collectively referred to as metal layers L1, of the redistribution structure 114. In an embodiment, the island-shaped, the mesh-shaped, and the strip-shaped dummy metal patterns are formed in each of the metal layers $L_n$. In other words, each of the metal layers $L_n$ has the above mentioned three different types of dummy metal patterns. The different types of dummy metal patterns may be formed depending on different performance considerations. For example, if a die 105 is susceptible to EM interference, the mesh-shaped dummy metal patterns may be used in a region corresponding to the die 105 to shield EM interference. As another example, the island-shaped dummy metal patterns may be used in regions that tend to have high stress to reduce any stress induced by the dummy metal patterns.

In another embodiment, two different dummy metal patterns are used alternately in the metal layers $L_n$. In other words, a first type of dummy metal patterns (e.g., the island-shaped dummy metal patterns) are formed in odd-numbered metal layers L1, L3, L5, and so on, and a second type of dummy metal patterns (e.g., the mesh-shaped dummy metal patterns) are formed in even-numbered metal layers L2, L4, L6, and so on.

Figure 5:
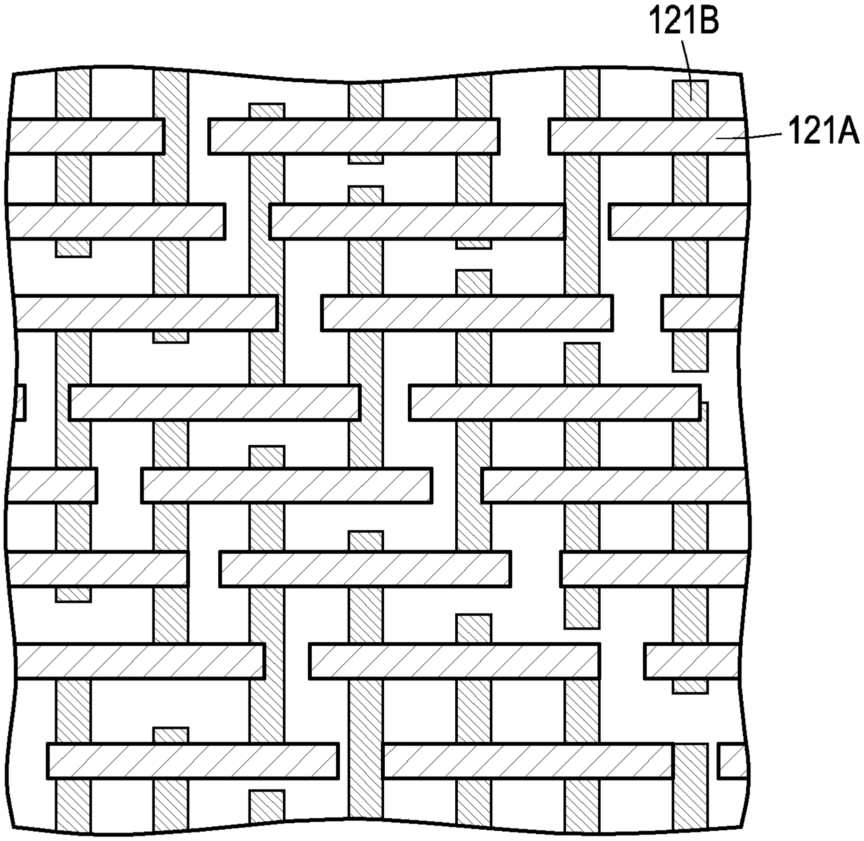
FIG. 5 illustrates a plan view of dummy metal patterns in the semiconductor device of FIG. 3, in accordance with an embodiment.

In yet another embodiment, as illustrated in FIG. 5, a first plurality of strip-shaped dummy metal patterns 121A, having longitudinal axes along a first direction (e.g., the horizontal direction of FIG. 5), is formed in odd-numbered metal layers L1, L3, L5, and so on, and a second plurality of strip-shaped dummy metal patterns 121B, having longitudinal axes along a second direction (e.g., the vertical direction of FIG. 5) perpendicular to the first direction, is formed in even-numbered metal layers L2, L4, L6, and so on. For clarity and to avoid cluttering, FIG. 5 illustrates a plan view of the dummy metal patterns 121A and 121B formed in two adjacent metal layers (e.g., L1 and L2) of the redistribution structure 114 of the semiconductor device 100. Recall that stress induced by the strip-shaped dummy metal patterns are along the longitudinal direction of the metal strips. Therefore, by aligning the longitudinal directions of the dummy metal strips in adjacent metal layers along two perpendicular directions, the stress induced by the strip-shaped dummy metal patterns are evened out, thereby achieving a more uniform stress within the redistribution structure 114.

FIGS. 6-11 illustrate various example plan views of dummy metal patterns in the semiconductor device 100, in accordance with some embodiments. Note that FIGS. 4A-4C and 5 show the various embodiment shapes of dummy metal patterns formed in the redistribution structure 114, FIGS. 6-11 show various embodiment locations of the dummy metal patterns in the redistribution structure 114. The dummy metal patterns in the redistribution structure 114 of semiconductor device 100 may have any of the embodiment shapes and may be formed in any of the embodiment locations. In other words, any of the example shapes of the dummy metal patterns illustrated in FIGS. 4A-4C and 5 may be formed in any of the example locations of the dummy metal patterns illustrated in FIGS. 6-11. For simplicity, no all components of the semiconductor device 100 are illustrated in FIGS. 6-11.

Figure 6:
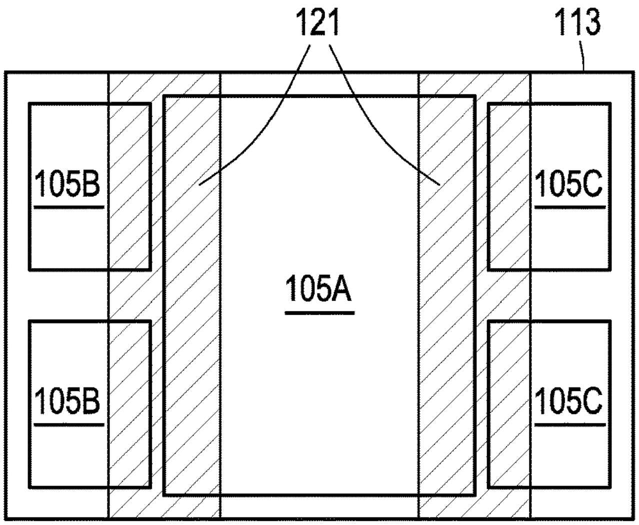
FIGS. 6-11 illustrate various example plan views of dummy metal patterns in the semiconductor device of FIG. 3, in accordance with some embodiments.

In the example of FIG. 6, the semiconductor device 100 includes a die 105A (e.g., an SOC die) in the middle, two dies 105B (e.g., HBM modules) on the left side of the die 105A aligned in a column, and two dies 105C (e.g., chiplets) on the right side of the dies 105A aligned in a column. FIG. 6 further illustrates sidewalls of the molding material 113, which define the perimeters of the semiconductor device 100 in FIG. 6. The shaded regions (e.g., with hatch patterns) in FIG. 6 illustrate the locations of the dummy metal patterns 121.

As illustrated in FIG. 6, the dummy metal patterns 121 are formed along the interface regions between the die 105A and the dies 105B, and along the interface regions between the die 105A and the dies 105C. In the discussion herein, the phrase “interface region” is used to describe a gap area between two or more adjacent dies 105. In the plan view of FIG. 6, the regions of the dummy metal patterns 121 overlap with the interface regions discussed above, and overlap with portions of the dies 105 proximate to the interface regions. The dummy metal patterns 121 extends continuously from a first sidewall (e.g., the upper sidewall in FIG. 6) to a second opposing sidewall (e.g., the lower sidewall in FIG. 6) of the molding material 113. Notably in FIG. 6, a center region of the die 105A is exposed by (e.g., is free of) the dummy metal patterns 121, and portions of the dies 105B/105C distal to the die 105A are also exposed by (e.g., is free of) the dummy metal patterns 121.

Figure 7:
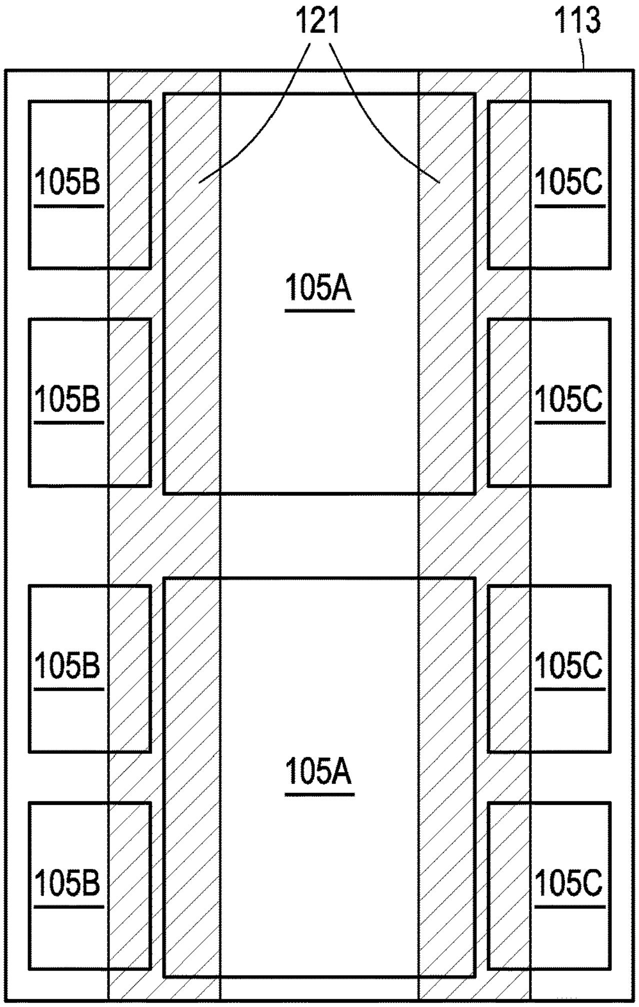

In the example of FIG. 7, the semiconductor device 100 is similar to that in FIG. 6, but includes twice the amount of dies 105. For example, the semiconductor device 100 in FIG. 7 includes two dies 105A, with four dies 105B aligned in a column on a first side of the dies 105A, and with four dies 105C aligned in a column on a second side of the dies 105A. The shaded regions illustrate the locations of the dummy metal patterns 121. Similar to FIG. 6, the dummy metal patterns 121 in FIG. 7 are formed along the interface regions between the die 105A and the dies 105B, and along the interface regions between the die 105A and the dies 105C. Details are the same as or similar to those of FIG. 6, thus are not repeated.

Figure 8:
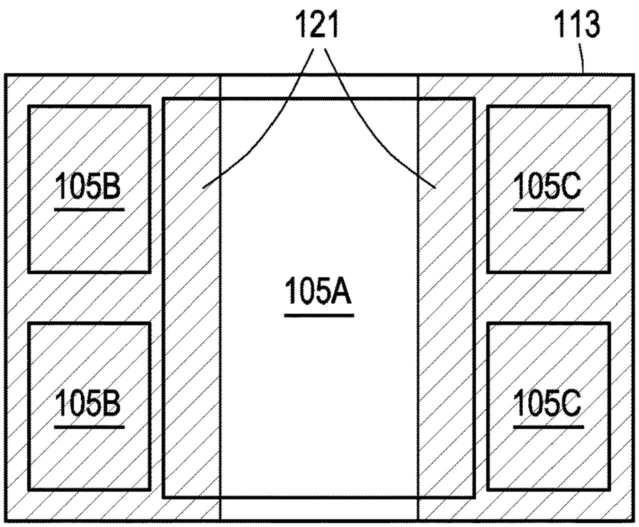

In the example of FIG. 8, the semiconductor device 100 is similar to that in FIG. 6, but the dummy metal patterns 121 are formed along the interface regions between the die 105A and the dies 105B, along the interface regions between the die 105A and the dies 105C, along the interface regions between the dies 105B, and along the interface regions between the dies 105C. In addition, the regions of the dummy metal patterns 121 completely cover (e.g., overlap) the regions of the dies 105B and 105C, while a center region of the die 105A is exposed by the dummy metal patterns 121.

Figure 9:
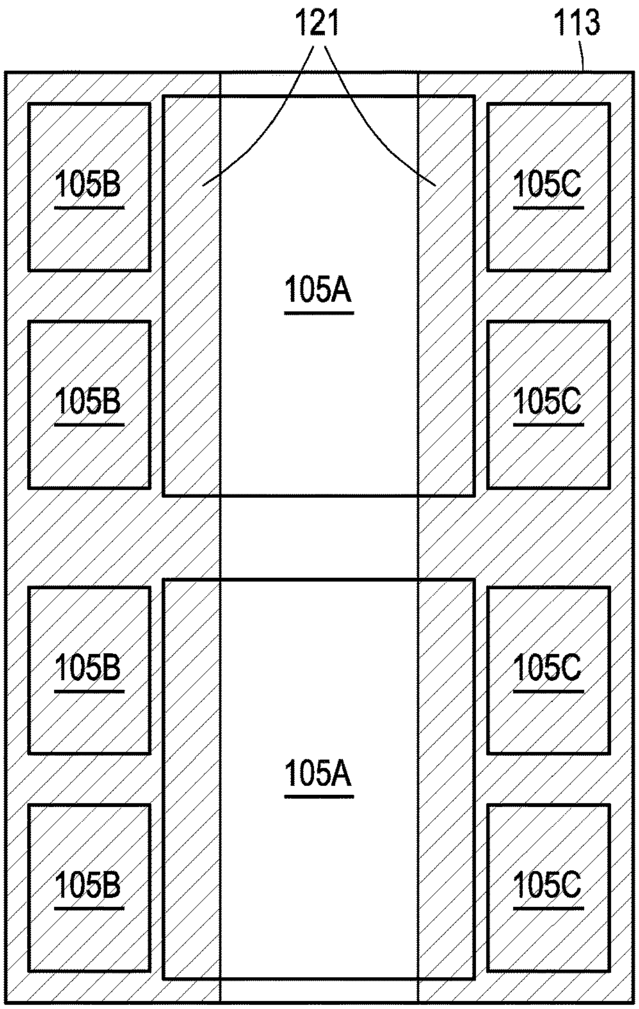

In the example of FIG. 9, the semiconductor device 100 is similar to that in FIG. 8, but includes twice the amount of dies 105. For example, the semiconductor device 100 in FIG. 9 includes two dies 105A, with four dies 105B aligned in a column on a first side of the dies 105A, and with four dies 105C aligned in a column on a second side of the dies 105A. The shaded regions illustrate the locations of the dummy metal patterns 121. Details are the same as or similar to those of FIG. 8, thus are not repeated.

Figure 10:
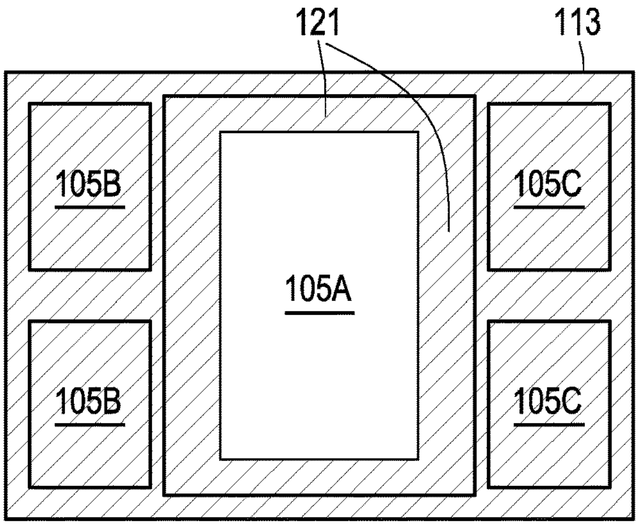

In the example of FIG. 10, the semiconductor device 100 is similar to that in FIG. 8, but the dummy metal patterns 121 are also formed along perimeters (e.g., sidewalls) of the semiconductor device 100, in addition to the regions shown in FIG. 8. Therefore, the regions of the dummy metal patterns 121 in FIG. 10 form a complete circle (or a complete rectangular band) along sidewalls of the semiconductor device 100. A center region of the die 105A is free of the dummy metal patterns 121.

Figure 11:
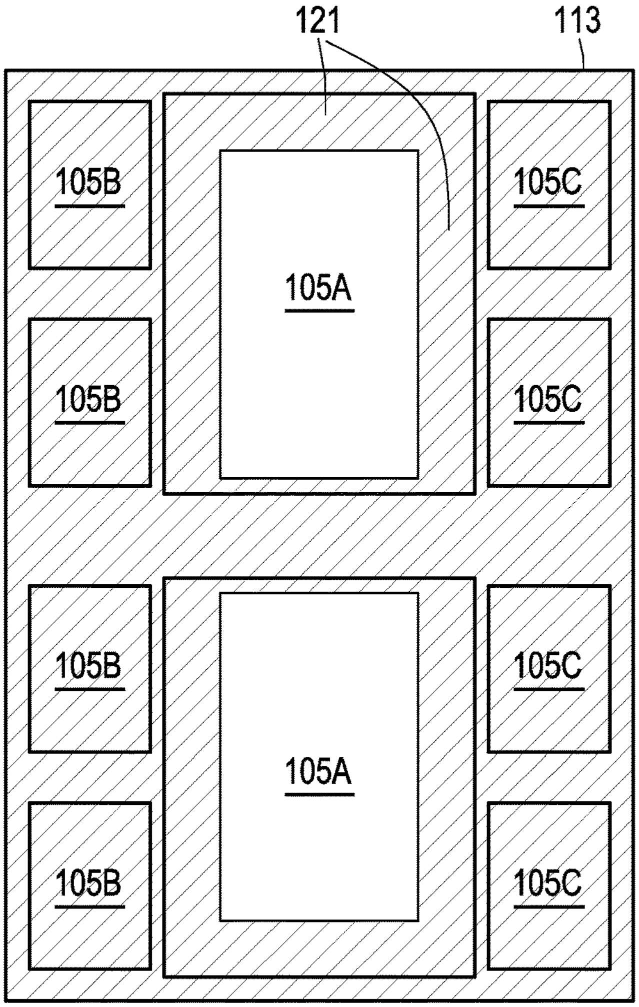

In the example of FIG. 11, the semiconductor device 100 is similar to that in FIG. 10, but includes twice the amount of dies 105. For example, the semiconductor device 100 in FIG. 11 includes two dies 105A, with four dies 105B aligned in a column on a first side of the dies 105A, and with four dies 105C aligned in a column on a second side of the dies 105A. The shaded regions illustrate the locations of the dummy metal patterns 121. Similar to FIG. 10, the dummy metal patterns 121 in FIG. 11 are formed along the interface regions between the dies 105A and the dies 105B, along the interface regions between the dies 105A and the dies 105C, and along the perimeters of the semiconductor device 100. In addition, the dummy metal patterns 121 are also formed in the interface region between the dies 105A, as shown by the shaded region extending horizontally in the center of the semiconductor device 100 of FIG. 11.

Figure 12:
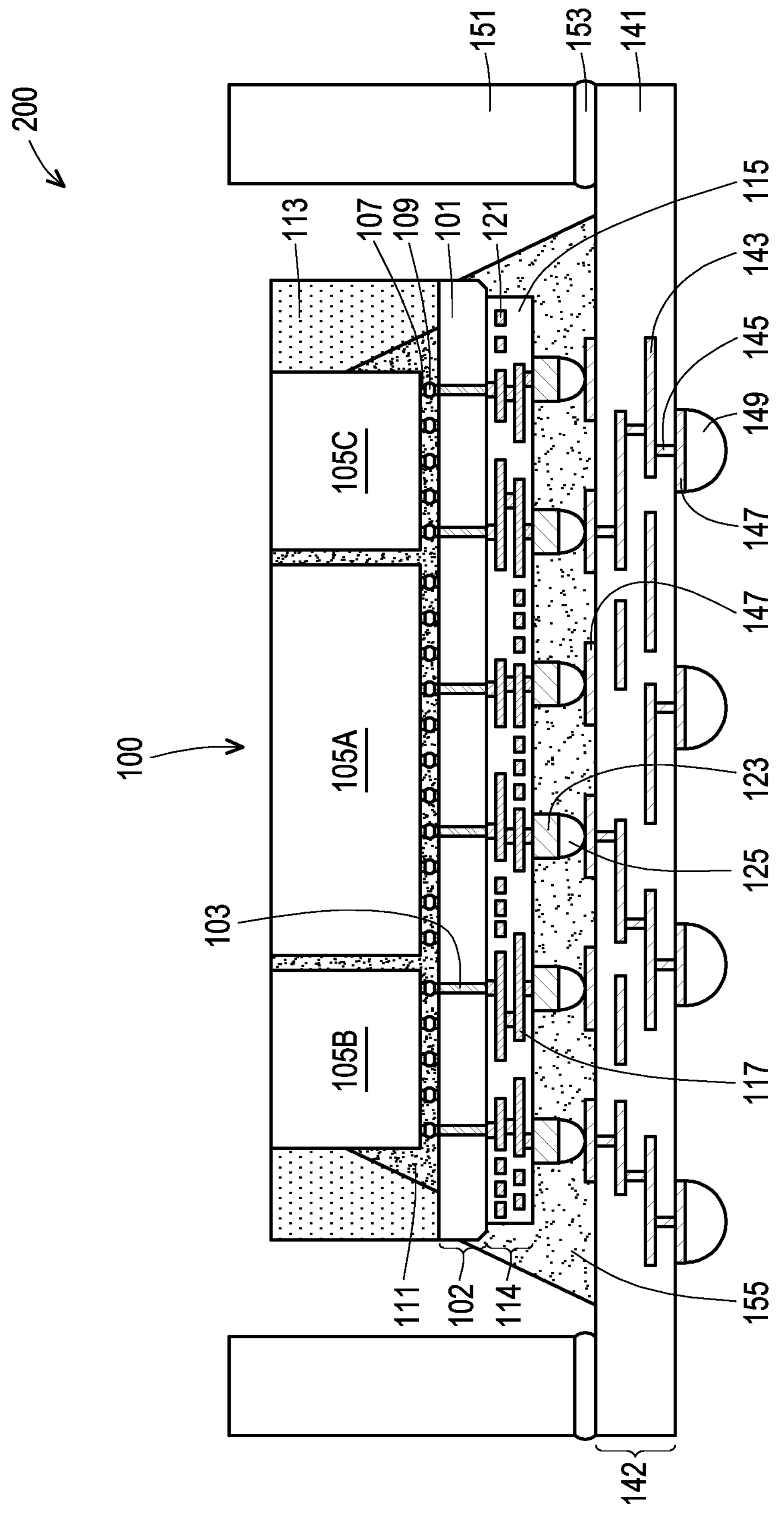
FIG. 12 illustrates a cross-sectional view of a semiconductor device, in accordance with an embodiment.

FIG. 12 illustrates a cross-sectional view of a semiconductor device 200, in accordance with an embodiment. The semiconductor device 200 is formed by bonding the semiconductor device 100 in FIG. 3 to a substrate 142 to form a stacked semiconductor structure.

Looking at the substrate 142, the substrate 142 is a multiple-layer circuit board, in some embodiments. For example, the substrate 142 may include one more dielectric layers 141 formed of bismaleimide triazine (BT) resin, FR-4 (a composite material composed of woven fiberglass cloth with an epoxy resin binder that is flame resistant), ceramic, glass, plastic, tape, film, or other supporting materials. The substrate 142 may include electrically conductive features (e.g., conductive lines 143 and vias 145) formed in/on the substrate 142. As illustrated in FIG. 12, the substrate 142 has conductive pads 147 formed on the upper surface and the lower surface of the substrate 142, which conductive pads 147 are electrically coupled to the conductive features of the substrate 142.

In some embodiments, to form the semiconductor device 200, the external connectors 123 of the semiconductor device 100 are aligned with respective conductive pads 147 on the upper surface of the substrate 142, and a reflow process is performed to bond the external connectors 123 to the conductive pads 147, e.g., through solder regions 125. Next, an underfill material 155 is formed between the redistribution structure 114 and the substrate 142. The underfill material 155 may be the same as or similar to the underfill material 111, and may be formed by a same or similar formation method, thus details are not repeated.

As more and more dies 105 are integrated into the stacked semiconductor structure (e.g., the semiconductor device 200) to provide semiconductor devices with enhanced functionalities and/or more storage capacity (e.g., memory capacity), the size of the interposer 102 and the size of the substrate 142 may be increased to accommodate the dies 105. As the size of the substrate 142 increases, it is increasingly difficult to keep the substrate 142 flat (e.g., having planar upper surface and/or planar lower surface). Warpage of the substrate 142 may make it difficult to bond the semiconductor device 200 to another work piece (e.g., a mother board under the substrate 142, not shown), since the conductive pads 147 at the lower surface of the substrate 142 are not disposed in a same plane due to warpage of the substrate 142. Issues, such as cold joints, may occur if a warped substrate 142 is attached to a mother board. Similarly, it may be difficult to bond the stacked semiconductor structure to the substrate 142, if the substrate 142 is not flat.

To control (e.g., reduce) the warpage of the substrate 142, a ring 151 is attached to the upper surface of the substrate 142 by an adhesive material 153, and is used to improve the planarity (e.g., flatness) of the substrate 142. In some embodiments, the ring 151 is formed of a rigid material, such as steel, copper, glass, or the like. In some embodiments, the ring 151 is a rectangular ring (e.g., having a hallow rectangle shape in a top view), and is attached to substrate 142 such that the ring 151 surrounds the semiconductor device 100. The ring 151 is attached to the upper surface of the substrate 142 after the stacked semiconductor structure is formed, in some embodiment. In other embodiments, the ring 151 is attached to the upper surface of the substrate 142 first, and thereafter, the semiconductor device 100 is attached to the upper surface of the substrate 142 inside the ring 151.

Figure 13:
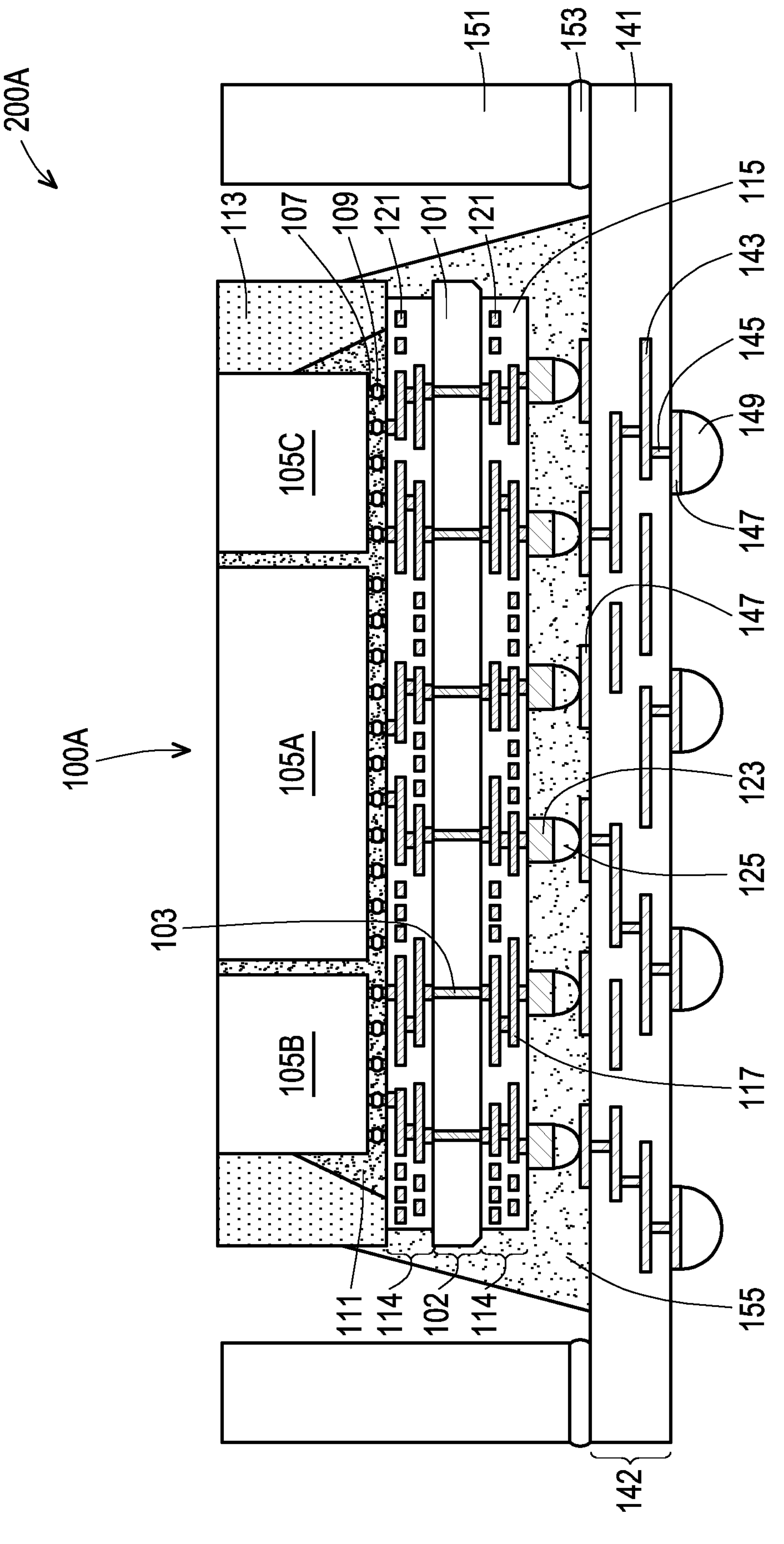
FIG. 13 illustrates a cross-sectional view of a semiconductor device, in accordance with another embodiment.

FIG. 13 illustrates a cross-sectional view of a semiconductor device 200A, in accordance with another embodiment. The semiconductor device 200A is similar to the semiconductor device 200 of FIG. 12, with a semiconductor device 100A bonded to the substrate 142 to form a stacked semiconductor structure. The semiconductor device 100A is similar to the semiconductor device 100 of FIG. 3, but with redistribution structures 114 formed on the front side and the backside of the interposer 102. The processing illustrated in FIGS. 1-3 may be modified to form the semiconductor device 100A. For example, the redistribution structures 114 between the interposer 102 and the dies 105 may be formed on the front side 102F of the interposer 102, before the dies 105 are attached to the interposer 102. In some embodiments, the same or similar dummy metal patterns 121 discussed above for the semiconductor device 100 are formed in both of the redistribution structures 114 of the semiconductor device 100A. Details are not repeated here.

Figure 14:
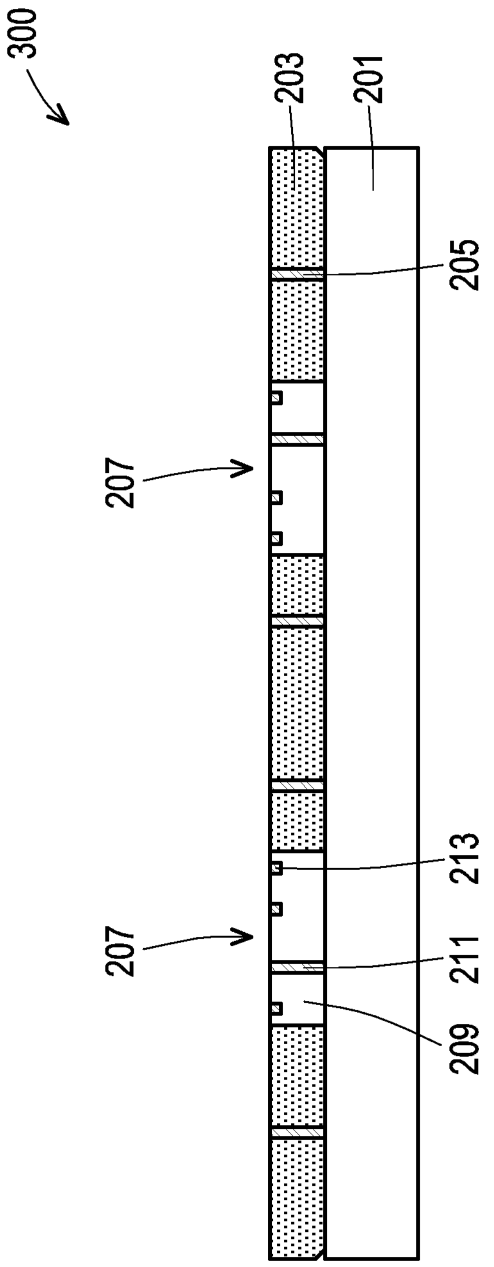
FIGS. 14-16 illustrate cross-sectional views of a semiconductor device at various stages of manufacturing, in accordance with an embodiment.
Figure 15:
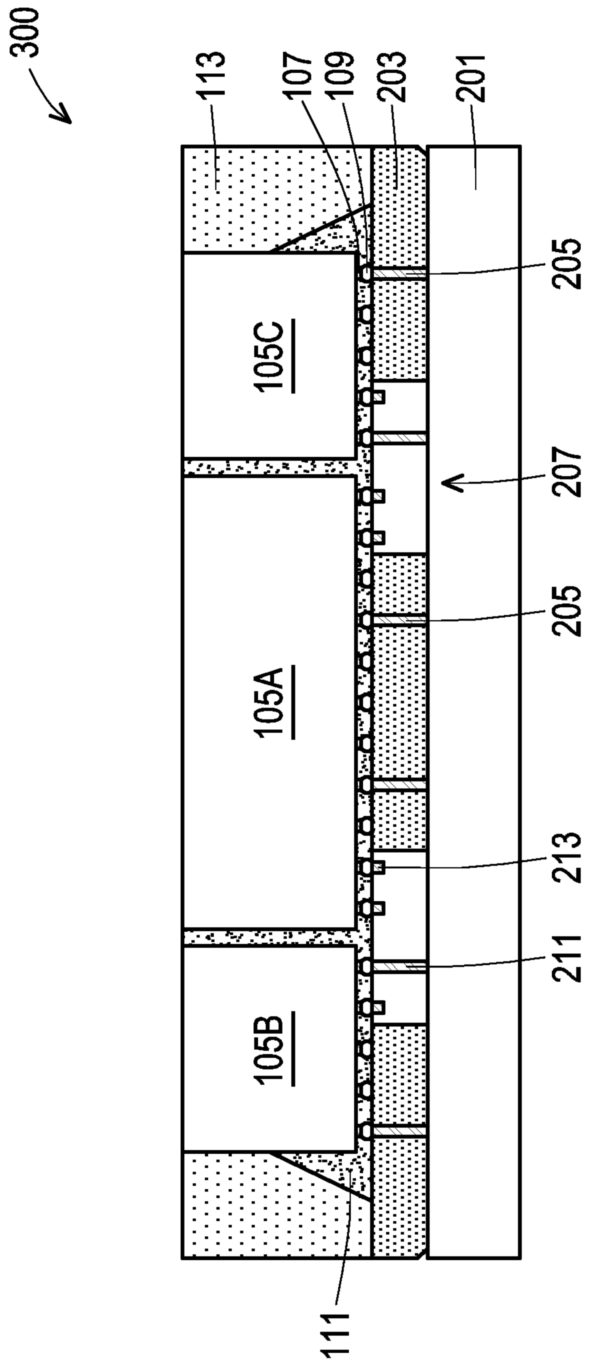
Figure 16:
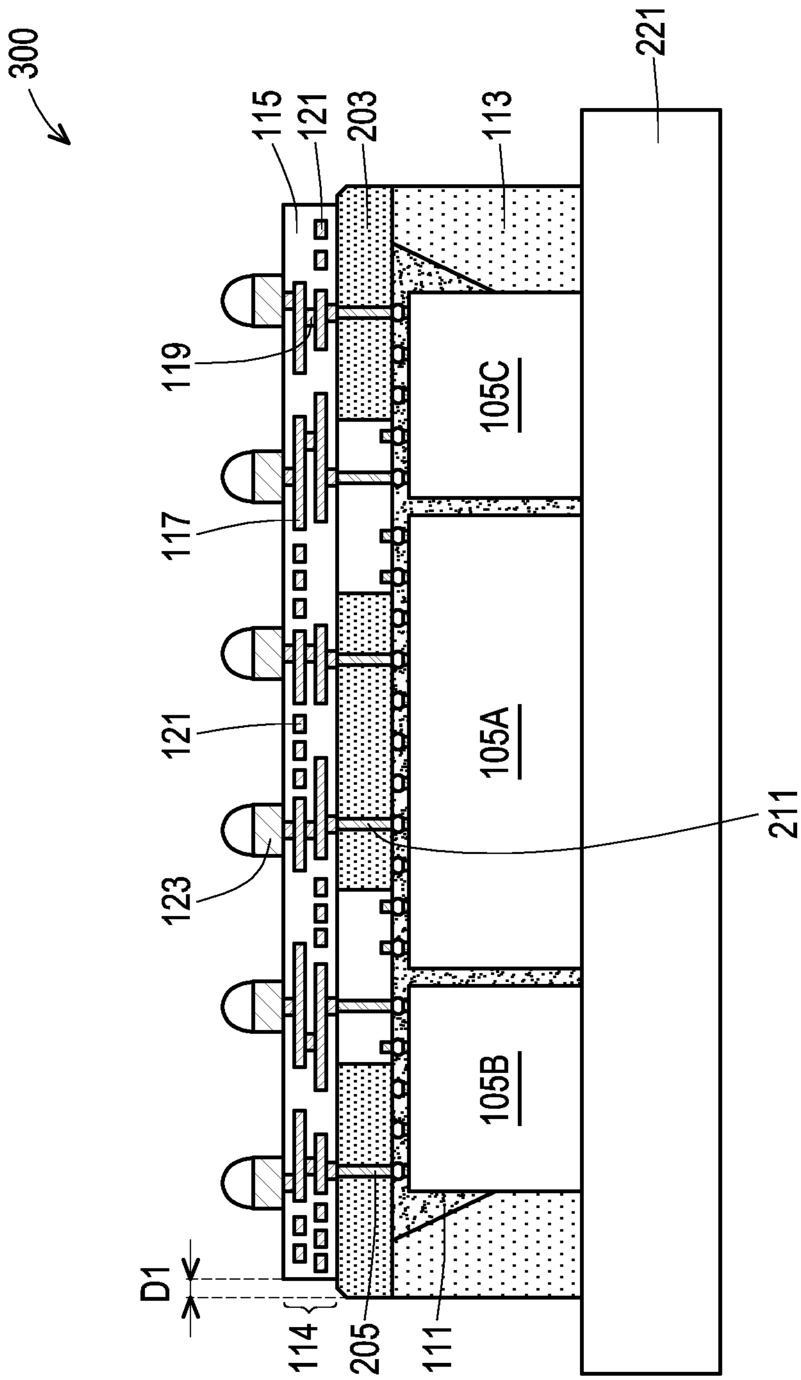

FIGS. 14-16 illustrate cross-sectional views of a semiconductor device 300 at various stages of manufacturing, in accordance with an embodiment. In FIG. 14, conductive pillars 205 are formed over a carrier 201, and Local Silicon Interconnect (LSI) dies 207 are attached to the carrier 201. The carrier 201 may be the same as or similar to the carrier 133 of FIG. 2, thus details are not repeated.

The conductive pillars 205 may be formed by: forming a seed layer over the carrier 201, forming a patterned photoresist layer over the seed layer, where the patterned photoresist layer have openings (e.g., through holes) exposing the seed layer, filling the openings (e.g., by plating) with a conductive material (e.g., copper), removing the patterned photoresist layer, and removing portions of the seed layer on which no conductive material is formed.

The LSI dies 207 are pre-formed prior to being attached to the carrier 201. In some embodiments, the LSI dies 207 includes a substrate (e.g., Si), a dielectric layer (e.g., silicon oxide) over the substrate, and a redistribution structure that includes one or more dielectric layers (e.g., silicon oxide) and conductive features (e.g., conductive lines and vias) formed in the one or more dielectric layers. In some embodiments, the LSI dies 207 are formed using the same processing for forming the interconnect structure of a semiconductor die in the back-end-of-line (BEOL) processing, and therefore, the critical dimension (e.g., line width, or line pitch) of the LSI dies 207 is the same as that of the interconnect structure to allow for high-density routing. The LSI dies 207 may optionally have through substrate vias

211. In the example of FIG. 14, the backsides of the LSI dies 207 are attached to the carrier 201, e.g., by a glue layer such as LTHC coating. The LTHC coating may be formed on the carrier 201 before the conductive pillars 205 are formed and before the LSI dies 207 are attached, in order to facilitate removal of the carrier 201 in subsequent processing.

Next, a molding material 203, which is same as or similar to the molding material 113, is formed on the carrier 201 around the conductive pillars 205 and the LSI dies 207. Next, a planarization process, such as CMP, is performed to remove excess portions of the molding material 203 and to achieve a coplanar upper surface between the conductive pillars 205, the LSI dies 207, and the molding material 203. The conductive pads 213 of the LSI dies 207 are exposed at the upper surface of the molding material 203. The conductive pillars 205 therefore become vias that extend through the molding material 203.

Next, in FIG. 15, the dies 105 (e.g., 105A, 105B, and 105C) are bonded to the conductive pillars 205, and the conductive pads 213/through substrate vias 211 of the LSI dies 207. As illustrated in FIG. 15, each LSI die 207 laterally overlaps with at least two dies 105, and provides electrical connection between the at least two dies 105 through its redistribution structure. Next, the underfill material 111 is formed between the dies 105 and the molding material 203. After the underfill material 111 is formed, the molding material 113 is formed over the molding material 203 around the dies 105 and around the underfill material 111. In some embodiments, the underfill material 111 is omitted. Next, a planarization process, such as CMP, is performed to expose the backsides of the dies 105 and to achieve a coplanar upper surface between the die 105 and the molding material 113.

Next, in FIG. 16, the structure formed in FIG. 15 is flipped over and attached to a carrier 221, and the redistribution structure 114 is formed over the molding material 203, using the same or similar processing as illustrated in FIG. 2. The redistribution structure 114 has dummy metal patterns 121 to control the warpage of the semiconductor structure formed. The redistribution structure 114 is electrically coupled to the conductive pillars 205 and the LSI dies 207. Next, the external connectors 123 are formed over and electrically coupled to the redistribution structure 114. The processing is the same as or similar to that of FIG. 2, thus details are not repeated here. Note that in some embodiments, an offset D1 between sidewalls of the redistribution structure 114 and respective sidewalls of the molding material 203 are formed.

The structure in FIG. 16, after removing the carrier 221 and performing a dicing process, forms a plurality of individual semiconductor device 300. Note that in FIG. 3, the semiconductor device 100 includes an interposer 102 (e.g., a silicon interposer). In contrast, the semiconductor device 300 of FIG. 16 replaces the interposer 102 with the LSI dies 207 (and the conductive pillars 205 and the molding material 203).

Figure 17:
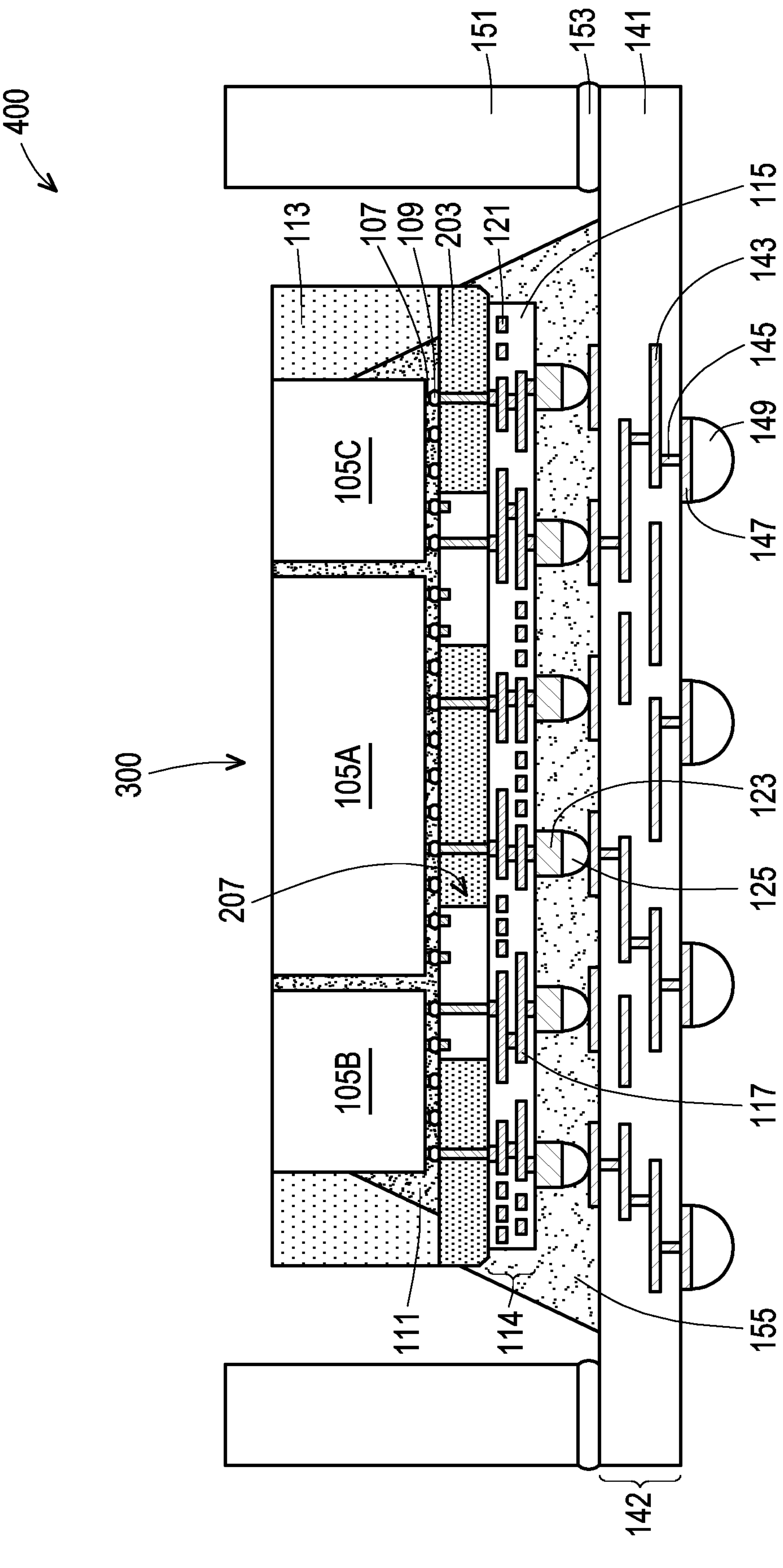
FIG. 17 illustrates a cross-sectional view of a semiconductor device, in accordance with an embodiment.

FIG. 17 illustrates a cross-sectional view of a semiconductor device 400, in accordance with an embodiment. The semiconductor device 400 has a stacked semiconductor structure, and is formed by: bonding the semiconductor device 300 of FIG. 16 to the substrate 142, forming the underfill material 155 on the substrate 142 around the semiconductor device 300, and attaching the ring 151 on the substrate 142 around the semiconductor device 300. The processing is same as or similar to that of FIG. 12, thus details are not repeated.

Figure 18:
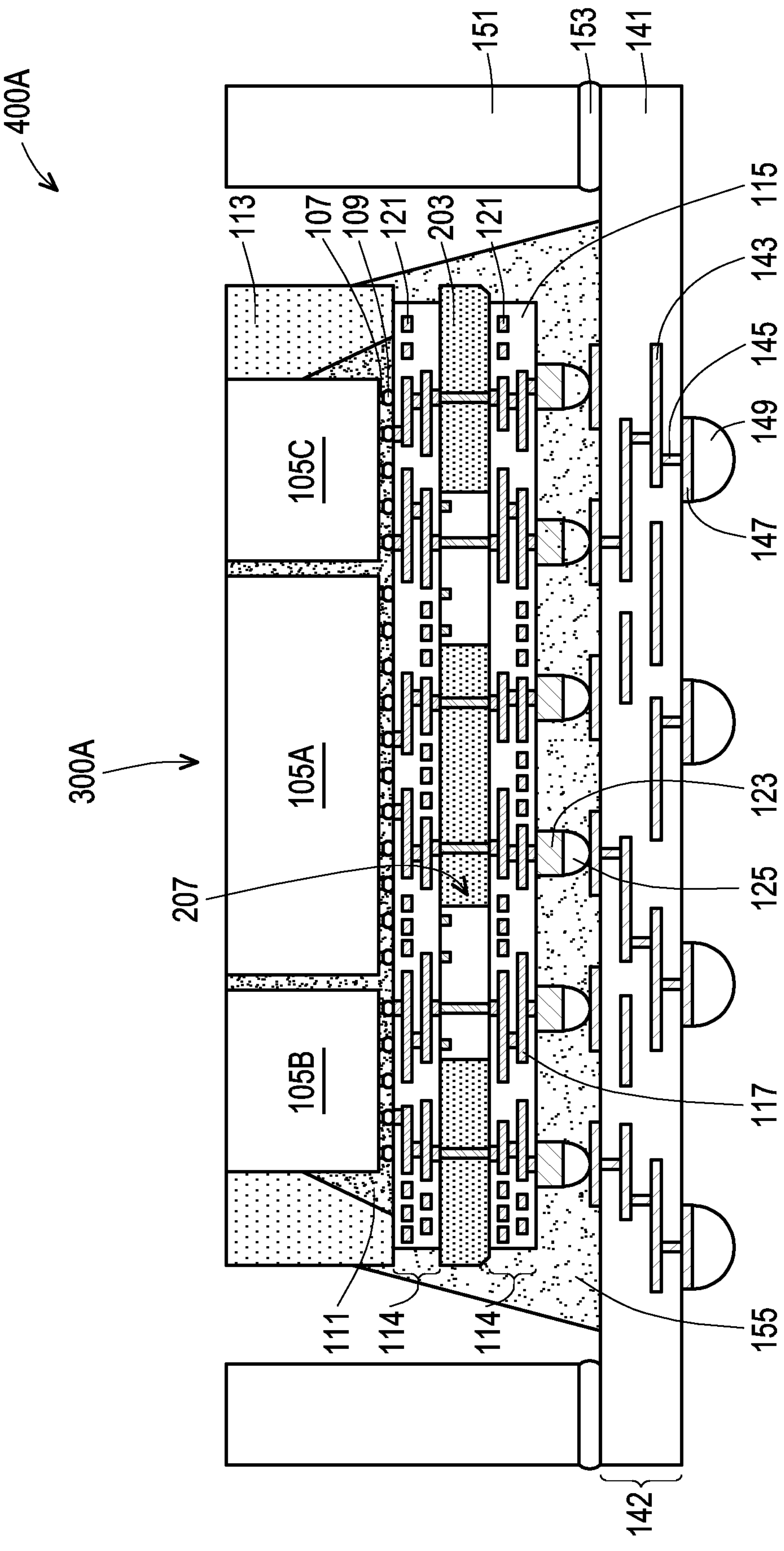
FIG. 18 illustrates a cross-sectional view of a semiconductor device, in accordance with another embodiment.

FIG. 18 illustrates a cross-sectional view of a semiconductor device 400A, in accordance with another embodiment. The semiconductor device 400A has a stacked semiconductor structure, and is similar to the semiconductor device 400 of FIG. 17. In FIG. 18, a semiconductor device 300A is bonded to the substrate 142. The semiconductor device 300A is similar to the semiconductor device 300 of FIG. 16, but with redistribution structures 114 formed on both the upper side and the lower side of the molding material 203. The redistribution structures 114 has dummy metal patterns 121 formed therein. The semiconductor device 300A may be formed by modifying the processing for forming the semiconductor device 300, as skilled artisans readily appreciate, thus details are not discussed here.

Figure 19:
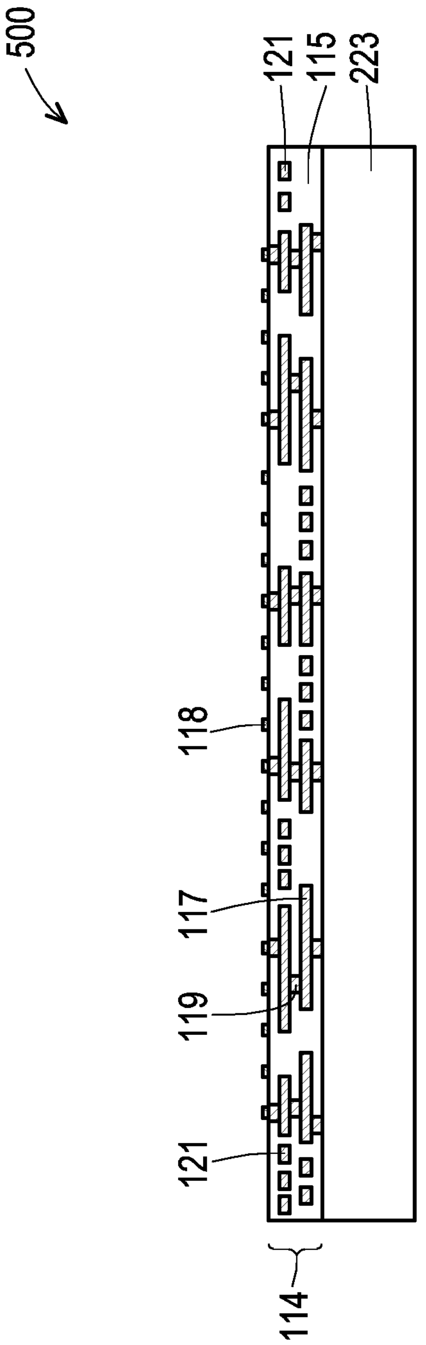
FIGS. 19-21 illustrate cross-sectional views of a semiconductor device at various stages of manufacturing, in accordance with an embodiment.
Figure 20:
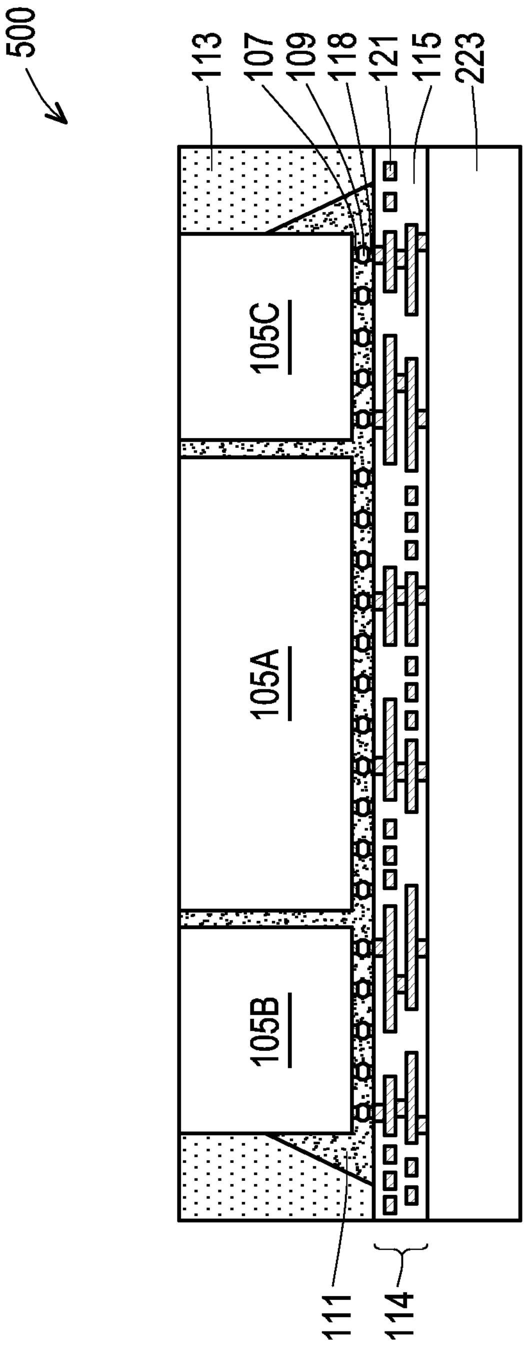
Figure 21:
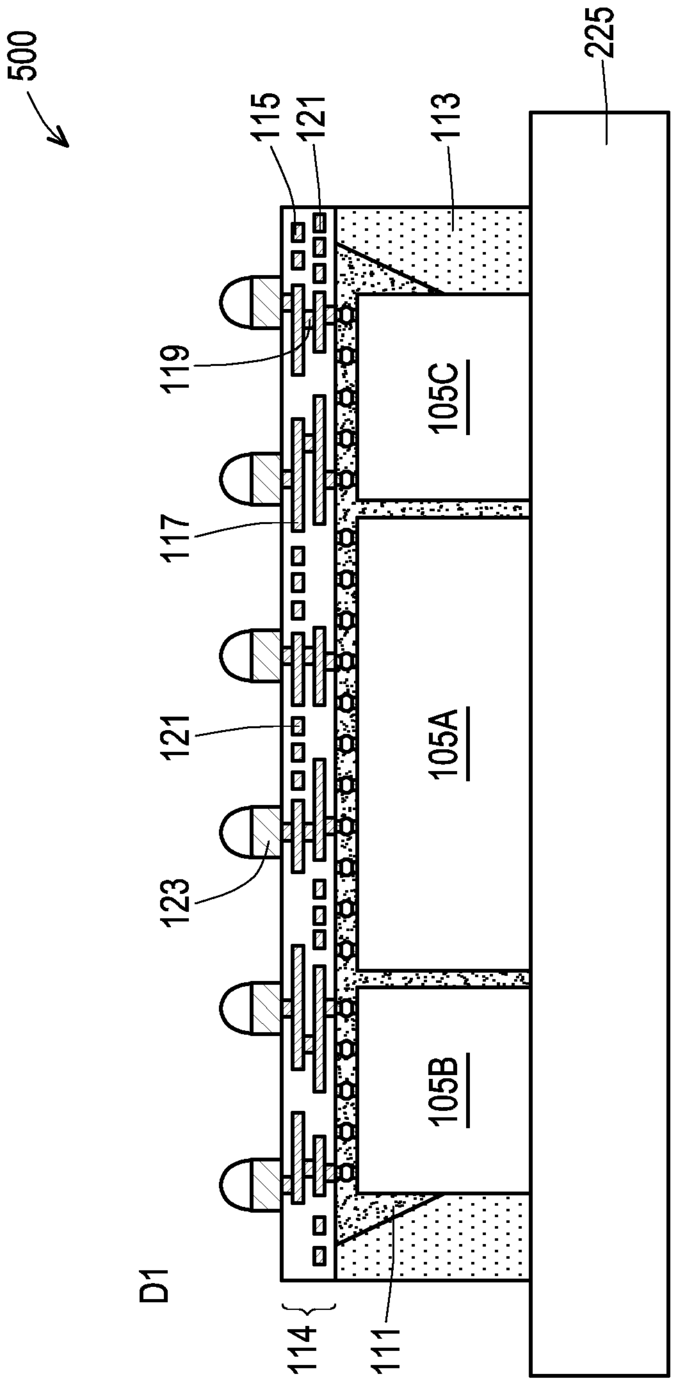

FIGS. 19-21 illustrate cross-sectional views of a semiconductor device 500 at various stages of manufacturing, in accordance with an embodiment. In FIG. 19, the redistribution structure 114 having dummy metal patterns 121 is formed over a carrier 223, using the same or similar processing for forming the redistribution structure 114 in FIG. 2. Conductive bumps 118 (e.g., microbumps) are formed over and electrically coupled to the redistribution structure 114.

Next, in FIG. 20, the conductive pillars 107 of the dies 105 (e.g., 105A, 105B, and 105C) are bonded to the conductive bumps 118, e.g., through solder regions 109. Next, the underfill material 111 is formed between the dies 105 and the redistribution structure 114. After the underfill material 111 is formed, the molding material 113 is formed over the redistribution structure 114 around the dies 105 and around the underfill material 111. In some embodiments, the underfill material 111 is omitted. Next, a planarization process, such as CMP, is performed to expose the backsides of the dies 105 and to achieve a coplanar upper surface between the molding material 113 and the dies 105.

Next, in FIG. 21, the carrier 223 is removed, and the structure in FIG. 20 is flipped over and attached to a carrier 225. Next, the external connectors 123 are formed over and electrically coupled to the redistribution structure 114.

The structure shown in FIG. 21, after removing the carrier 225 and performing a dicing process, forms a plurality of individual semiconductor devices 500. Note that in contrast to the semiconductor structure of FIG. 3, the semiconductor devices 500 does not have the interposer 102, and the dies 105 are bonded directly to the redistribution structure 114.

Figure 22:
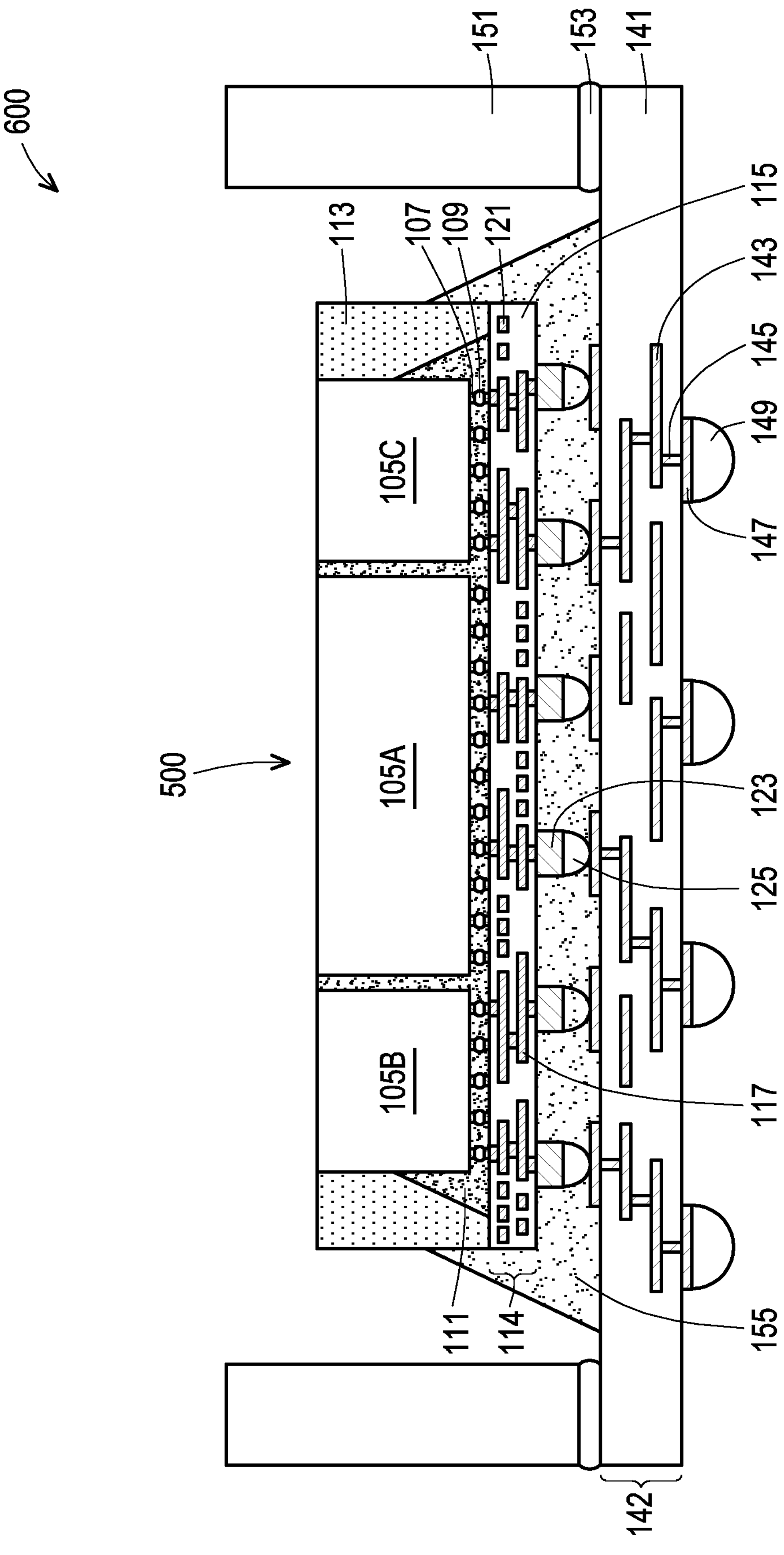
FIG. 22 illustrates a cross-sectional view of a semiconductor device, in accordance with an embodiment.

FIG. 22 illustrates a cross-sectional view of a semiconductor device 600, in accordance with an embodiment. The semiconductor device 600 has a stacked semiconductor structure, and is formed by: bonding the semiconductor device 500 to the substrate 142, forming the underfill material 155 on the substrate 142 around the semiconductor device 500, and attaching the ring 151 on the substrate 142 around the semiconductor device 500. The processing is same as or similar to that of FIG. 12, thus details are not repeated.

Embodiments may achieve advantages. For example, by forming the dummy metal patterns in the redistribution structure 114, warpage of the semiconductor structure (e.g., the semiconductor device 100) is reduced. The improved planarity of the semiconductor structure makes it easier to bond the semiconductor structure to the substrate 142 to form the stacked semiconductor structure. Issues such as cold joint are avoided or reduced, and as a result, the bonding yield for the semiconductor structure is improved. In addition, by forming the offset D1, delamination of the redistribution structure 114 during the dicing process is avoided.

Figure 23:
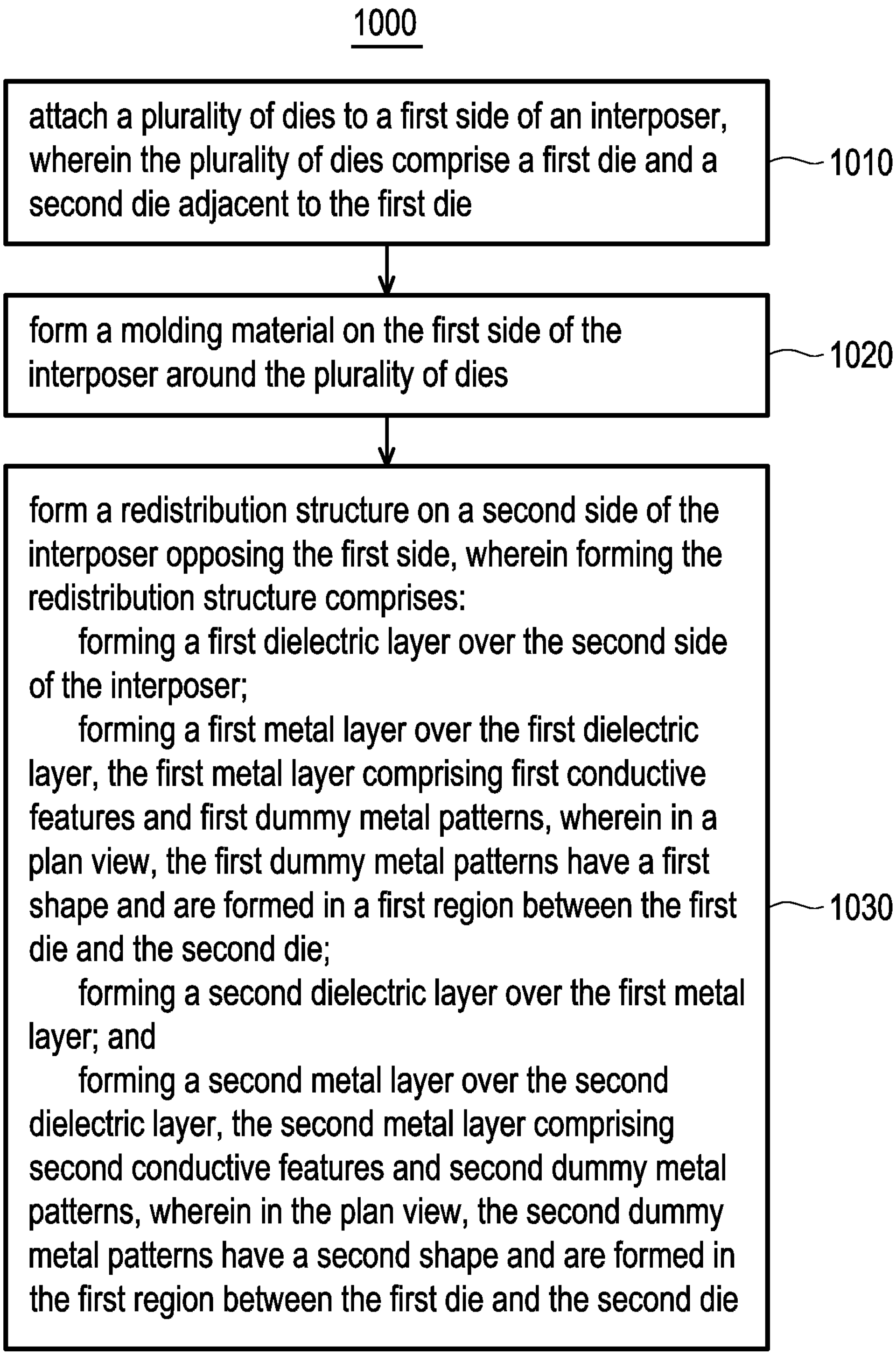
FIG. 23 illustrates a flow chart of a method of forming a semiconductor device, in some embodiments.

FIG. 23 illustrates a flow chart of a method of forming a semiconductor device, in some embodiments. It should be understood that the embodiment method shown in FIG. 23 is merely an example of many possible embodiment methods. One of ordinary skill in the art would recognize many variations, alternatives, and modifications. For example, various steps as illustrated in FIG. 23 may be added, removed, replaced, rearranged and repeated.

Referring to FIG. 23, at block 1010, a plurality of dies are attached to a first side of an interposer, wherein the plurality of dies comprise a first die and a second die adjacent to the first die. At block 1020, a molding material is formed on the first side of the interposer around the plurality of dies. At block 1030, a redistribution structure is formed on a second side of the interposer opposing the first side, wherein forming the redistribution structure comprises: forming a first dielectric layer over the second side of the interposer; forming a first metal layer over the first dielectric layer, the first metal layer comprising first conductive features and first dummy metal patterns, wherein in a plan view, the first dummy metal patterns have a first shape and are formed in a first region between the first die and the second die; forming a second dielectric layer over the first metal layer; and forming a second metal layer over the second dielectric layer, the second metal layer comprising second conductive features and second dummy metal patterns, wherein in the plan view, the second dummy metal patterns have a second shape and are formed in the first region between the first die and the second die.

In accordance with an embodiment, a semiconductor device includes: a substrate; a plurality of dies attached to a first side of the substrate; a molding material on the first side of the substrate around the plurality of dies; a first redistribution structure on a second side of the substrate opposing the first side, wherein the first redistribution structure comprises dielectric layers and conductive features in the dielectric layers, wherein the conductive features comprise conductive lines, vias, and dummy metal patterns isolated from the conductive lines and the vias; and conductive connectors attached to a first surface of the first redistribution structure facing away from the substrate. In an embodiment, the conductive features comprise a plurality of metal layers, wherein the dummy metal patterns are disposed in first metal layers of the plurality of metal layers, wherein in a plan view, the dummy metal patterns are island-shaped, strip-shaped, or mesh-shaped, wherein each of the first metal layers has the island-shaped, strip-shaped, and mesh-shaped dummy metal patterns. In an embodiment, the conductive features comprise a plurality of metal layers, wherein the dummy metal patterns comprise first dummy metal patterns in a first metal layer of the plurality of metal layers, and comprise second dummy metal patterns in a second metal layer of the plurality of metal layers, wherein in a plan view, the first dummy metal patterns in the first metal layer have a first shape, and the second dummy metal patterns in the second metal layer have a second shape. In an embodiment, the first shape is an island shape, and the second shape is a mesh shape. In an embodiment, in the plan view, the first dummy metal patterns are first metal strips having first longitudinal axes extending along a first direction, and the second dummy metal patterns are second metal strips having second longitudinal axes extending along a second direction perpendicular to the first direction. In an embodiment, the dummy metal patterns and the conductive lines are in the same metal layers of the conductive features, and no dummy metal pattern is in the metal layers of the vias. In an embodiment, the plurality of dies comprise a first die and a second die adjacent to the first die, wherein in the plan view, the plurality of dies are disposed within an area defined by sidewalls of the molding material, and the dummy metal patterns are disposed along a first interface region between the first die and the second die. In an embodiment, in the plan view, a center region of the first die is free of the dummy metal patterns. In an embodiment, the plurality of dies further comprise a third die adjacent to the first die, wherein in the plan view, the second die and the third die are aligned along a same column, and the dummy metal patterns are disposed along a second interface region between the second die and the third die. In an embodiment, in the plan view, the dummy metal patterns are disposed along the sidewalls of the molding material. In an embodiment, the semiconductor device further includes a second redistribution structure at the first side of the substrate, wherein the second redistribution structure is between the substrate and the plurality of dies, wherein the second redistribution structure comprises second dummy metal patterns. In an embodiment, the substrate is a substrate of a local silicon interconnect (LSI) die, wherein the semiconductor device further comprises: another molding material around the LSI die, wherein the another molding material is between the molding material and the first redistribution structure; and a conductive pillar extending through the another molding material, wherein the conductive pillar is coupled to one of the plurality of dies and the redistribution structure.

In accordance with an embodiment, a semiconductor device includes: a plurality of dies embedded in a molding material, wherein the plurality of dies comprise a first die and a second die adjacent to the first die; a redistribution structure, wherein the plurality of dies are bonded to a first side of the redistribution structure, wherein the redistribution structure comprises dielectric layers and conductive features in the dielectric layers, wherein the conductive features comprise conductive lines, vias, and dummy metal patterns, wherein the dummy metal pattern are electrically isolated, wherein in a plan view, the plurality of dies are disposed within a boundary defined by sidewalls of the molding material, the dummy metal patterns are disposed in a first region between the first die and the second die, and a center region of the first die is free of the dummy metal patterns; and conductive connectors attached to a second side the redistribution structure opposing the first side. In an embodiment, in the plan view, the dummy metal patterns are disposed along the boundary defined by the sidewalls of the molding material. In an embodiment, the conductive features comprise a plurality of metal layers, wherein the dummy metal patterns comprise first dummy metal patterns in a first metal layer of the plurality of metal layers, and comprise second dummy metal patterns in a second metal layer of the plurality of metal layers, wherein the first dummy metal patterns in the first metal layer have a first shape, and the second dummy metal patterns in the second metal layer have a second shape different from the first shape. In an embodiment, the semiconductor device further includes: a substrate at the second side the redistribution structure, wherein the conductive connectors are bonded to a first surface of the substrate; and an underfill material on the first surface of the substrate around the conductive connectors, the redistribution structure, and the molding material.

In accordance with an embodiment, a method of forming a semiconductor device includes: attaching a plurality of dies to a first side of an interposer, wherein the plurality of dies comprise a first die and a second die adjacent to the first die; forming a molding material on the first side of the interposer around the plurality of dies; and forming a redistribution structure on a second side of the interposer opposing the first side, wherein forming the redistribution structure comprises: forming a first dielectric layer over the second side of the interposer; forming a first metal layer over the first dielectric layer, the first metal layer comprising first conductive features and first dummy metal patterns, wherein in a plan view, the first dummy metal patterns have a first shape and are formed in a first region between the first die and the second die; forming a second dielectric layer over the first metal layer; and forming a second metal layer over the second dielectric layer, the second metal layer comprising second conductive features and second dummy metal patterns, wherein in the plan view, the second dummy metal patterns have a second shape and are formed in the first region between the first die and the second die. In an embodiment, in the plan view, a center of the first die is free of the first dummy metal patterns and the second dummy metal patterns. In an embodiment, the first shape is different from the second shape. In an embodiment, the first shape and the second shape are the same, wherein in the plan view, the first dummy metal patterns are first metal strips extending along a first longitudinal direction, and the second dummy metal patterns are second metal strips extending along a second longitudinal direction perpendicular to the first longitudinal direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
- a substrate;
- a plurality of dies attached to a first side of the substrate, wherein the plurality of dies comprise a first die and a second die adjacent to the first die;
- a molding material on the first side of the substrate around the plurality of dies;
- a first redistribution structure contacting and extending along a second side of the substrate opposing the first side, wherein the first redistribution structure comprises dielectric layers and conductive features in the dielectric layers, wherein the conductive features comprise conductive lines, vias, and dummy metal patterns isolated from the conductive lines and the vias, wherein in a plan view, the plurality of dies are disposed within an area defined by sidewalls of the molding material, and the dummy metal patterns are disposed along a first interface region between the first die and the second die; and
- conductive connectors attached to a first surface of the first redistribution structure facing away from the substrate.

2. The semiconductor device of claim 1, wherein the conductive features comprise a plurality of metal layers, wherein the dummy metal patterns are disposed in first metal layers of the plurality of metal layers, wherein in the plan view, the dummy metal patterns are island-shaped, strip-shaped, or mesh-shaped, wherein the strip-shaped dummy metal patterns comprise discrete portions that are physically and electrically isolated from one another, wherein each of the first metal layers has the island-shaped, strip-shaped, and mesh-shaped dummy metal patterns.

3. The semiconductor device of claim 1, wherein the dummy metal patterns and the conductive lines are in a first plurality of dielectric layers of the dielectric layers, and the vias are in a second plurality of dielectric layers of the dielectric layers, and wherein there is no dummy metal pattern in the second plurality of dielectric layers.

4. The semiconductor device of claim 1, wherein in the plan view, a center region of the first die is free of the dummy metal patterns.

5. The semiconductor device of claim 1, further comprising a second redistribution structure at the first side of the substrate, wherein the second redistribution structure is between the substrate and the plurality of dies, wherein the second redistribution structure comprises second dummy metal patterns.

6. The semiconductor device of claim 1, wherein a first width of the first redistribution structure, measured between opposing sidewalls of the first redistribution structure, is smaller than a second width of the substrate measured between opposing sidewalls of the substrate.

7. The semiconductor device of claim 1, further comprising an underfill material between the substrate and the plurality of dies.

8. The semiconductor device of claim 1, wherein the conductive features comprise a plurality of metal layers, wherein the dummy metal patterns comprise first dummy metal patterns in a first metal layer of the plurality of metal layers, and comprise second dummy metal patterns in a second metal layer of the plurality of metal layers, wherein in the plan view, the first dummy metal patterns in the first metal layer have a first shape, and the second dummy metal patterns in the second metal layer have a second shape.

9. The semiconductor device of claim 8, wherein the first shape is an island shape, and the second shape is a mesh shape.

10. The semiconductor device of claim 8, wherein in the plan view, the first dummy metal patterns are first metal strips having first longitudinal axes extending along a first direction, and the second dummy metal patterns are second metal strips having second longitudinal axes extending along a second direction perpendicular to the first direction, wherein the first metal strips are physically and electrically isolated from one another, and the second metal strips are physically and electrically isolated from one another.

11. The semiconductor device of claim 1, wherein the plurality of dies further comprise a third die adjacent to the first die, wherein in the plan view, the second die and the third die are aligned along a same column, and the dummy metal patterns are disposed along a second interface region between the first die and the third die.

12. The semiconductor device of claim 11, wherein in the plan view, the dummy metal patterns overlap at least portions of the sidewalls of the molding material.

13. A semiconductor device comprising:
- a plurality of dies embedded in a molding material, wherein the plurality of dies comprise a first die and a second die adjacent to the first die;
- a redistribution structure, wherein the plurality of dies are bonded to a first side of the redistribution structure, wherein the redistribution structure comprises dielectric layers and conductive features in the dielectric layers, wherein the conductive features comprise conductive lines, vias, and dummy metal patterns, wherein the dummy metal patterns are electrically isolated, wherein in a plan view, the plurality of dies are disposed within a boundary defined by sidewalls of the molding material, the dummy metal patterns are disposed in a first region between the first die and the second die, and a center region of the first die is free of the dummy metal patterns; and conductive connectors attached to a second side of the redistribution structure opposing the first side.

14. The semiconductor device of claim 13, wherein in the plan view, the dummy metal patterns overlap at least portions of the boundary defined by the sidewalls of the molding material.

15. The semiconductor device of claim 13, wherein the conductive features comprise a plurality of metal layers, wherein the dummy metal patterns comprise first dummy metal patterns in a first metal layer of the plurality of metal layers, and comprise second dummy metal patterns in a second metal layer of the plurality of metal layers, wherein the first dummy metal patterns in the first metal layer have a first shape, and the second dummy metal patterns in the second metal layer have a second shape different from the first shape.

16. The semiconductor device of claim 13, further comprising:

a substrate at the second side of the redistribution structure, wherein the conductive connectors are bonded to a first surface of the substrate; and an underfill material on the first surface of the substrate around the conductive connectors, the redistribution structure, and the molding material.

17. A semiconductor device comprising:

an interposer;

a plurality of dies attached to a first side of the interposer, wherein the plurality of dies comprise a first die and a second die adjacent to the first die;

a molding material on the first side of the interposer around the plurality of dies; and a redistribution structure contacting and extending along a second side of the interposer opposing the first side, wherein a first width of the redistribution structure, measured between opposing sidewalls of the redistribution structure, is smaller than a second width of the interposer measured between opposing sidewalls of the interposer, wherein the redistribution structure comprises:

a first dielectric layer over the second side of the interposer;

first conductive features in the first dielectric layer, the first conductive features comprising first conductive lines and first dummy metal patterns, wherein in a plan view, the first dummy metal patterns have a first shape and are disposed in a first region between the first die and the second die;

a second dielectric layer over the first dielectric layer; and second conductive features in the second dielectric layer, the second conductive features comprising second conductive lines and second dummy metal patterns, wherein in the plan view, the second dummy metal patterns have a second shape and are disposed in the first region between the first die and the second die.

18. The semiconductor device of claim 17, wherein in the plan view, a center of the first die is free of the first dummy metal patterns and the second dummy metal patterns.

19. The semiconductor device of claim 17, wherein the first shape is different from the second shape.

20. The semiconductor device of claim 17, wherein the redistribution structure further comprises:

a third dielectric layer between the first dielectric layer and the second dielectric layer; and vias in the third dielectric layer, wherein the third dielectric layer is free of dummy metal patterns.

* * * * *